(12) United States Patent
Ahrikencheikh et al.

(10) Patent No.: US 6,233,706 B1
(45) Date of Patent: May 15, 2001

(54) METHOD AND APPARATUS FOR LIMITED ACCESS CIRCUIT TEST

(75) Inventors: Cherif Ahrikencheikh; Rodney A. Browen, both of Loveland; William P. Darbie, Longmont; John E. McDermid, Loveland; Kay C. Lannen, Ft. Collins, all of CO (US)

(73) Assignee: Agilent Technologies, Palo Alto, CA (US)

( * ) Notice: Subject to any disclaimer, the term of this patent is extended or adjusted under 35 U.S.C. 154(b) by 0 days.

(21) Appl. No.: 09/169,320

(22) Filed: Oct. 9, 1998

(51) Int. Cl.$^7$ .................................................. G01R 31/28
(52) U.S. Cl. .......................... 714/724; 714/799; 714/745
(58) Field of Search .................................. 714/724, 734, 714/799, 738, 745

(56) References Cited

U.S. PATENT DOCUMENTS

| 4,703,260 | * | 10/1987 | Beha et al. ............................ | 324/752 |
| 4,845,425 | * | 7/1989 | Beha et al. ............................ | 324/752 |
| 5,808,919 | | 9/1998 | Preist et al. ........................... | 364/579 |

OTHER PUBLICATIONS

Yoshio Togawa, Takashi Matsumoto, & Hideki Arai, "The Tf–Equivalence Class approach to Analog Fault Diagnosis Problems", IEEE Transactions on Circuits and Systmes, vol. CAS–33, No. 10, Oct. 1986, pp. 992–1009.

Gary D. Hactel, Robert K. Brayton, and Fred G. Gustavson, "The Sparse Tableu Approach to Network Analysis and Design" IEEE Transactions on Circuit Theory, vol, CT–18, No. 1 Jan. 1971, pp. 101–113.

Kenneth P. Parker, John e. Mcermid and Stig Oresjo "Structure and Metrology for an Analog Testability Bus" Proceeding of the IEEE International Test Conference, Baltimore, Maryland, Oct. 1993, pp. 309–322.

Juin–Lang Huang & Kwang–Ting Cheng "Analog Fault Diagnosis for Unpowered Circuit Boards" Proceedings of the IEEE International Test Conference, Washington, DC, Nov. 1997, pp. 640–648.

John McDermid "Limited Access Testing: IEEE 1149.4 Instrumentation & Method", Proceedings of the IEEE International Test Conference, Oct. 1998, pp. 388–3950

John McDermid, "Limited Access Testing: Ability and Requirements" Proceedings of the Technical Program. NEPRON West '98, March 1998, vol., 2, pp. 736–742.

R. Lui, "Testing and Diagnosis of Analog Circuits and Systems, " Van Nostrand & Reihold, NY, 1991.

S.D. Bedrosian, "On element Value Solution of Single–Element–Kind Networks", Ph. D. Dissertation, University of Pennsylvania, Dec. 1961.

Timothy N. Trick, Wataru Mayeda, and Adel A. Sakla, "Calculation of Parameter Values from Node Voltage Measurements", IEEE Transactions on Corcuits and Systems, vol. CAS–26, No. 7, pp. 466–474, Ju.1 1979.

(List continued on next page.)

Primary Examiner—Phung M. Chung
(74) Attorney, Agent, or Firm—Alexander J. Neudeck

(57) ABSTRACT

A system that can test individual components having tolerances on a circuit board without complete access to every node on the board is disclosed. The system uses a method that develops test limits from a model of the board, component tolerances, and a list of accessible nodes. A method of reducing the complexity of the test problem by limiting the number of components under consideration is also disclosed. A method of reducing the complexity of the test problem by limiting the number of nodes under consideration is also disclosed. A method of picking nodes to apply stimulus to a board is also disclosed. Finally, a method of correcting for certain parasitics associated with tester hardware is disclosed.

21 Claims, 17 Drawing Sheets

OTHER PUBLICATIONS

Zheng F, Huang, Chen–Shang Lin & Ruey–Wen Liu, "Node–Fault Diagnosis and a Design of Tesability", IEEE Transactions on Circuits and Systems, vol. CAS–30, No. 5, pp. 257–265, May 1983.

R.M. Biernacki and J.W. Bandler, "Fault Location of Analog Circuits", Proceedings of the 1980 IEEE International Symposium on Circuits & Systes, NY, 1980, pp. 1078–1081.

R. S. Berkowitz, "Conditions for Network–Element–Value Solvability", IRE Transactions on Circuit Theory, Mar. 1962, pp. 24–29.

L. Rapisarda & R.A. Decarlo, "Analog Multifrequency Fault Diagnosis", IEEE Transactions of Circuits & Systems, vol. CAS–30, No. 4, pp, 223–234, Apr. 1983.

Kwang–Ting (Tim) Cheng, "Test Point Selections for Analog Fault Diagnosis", Proposal Department of Electrical & Computer Engineering, University of California—Santa Barbara to Hewlett–Packard Company, 1996.

Jiri Vlach and Kishore Singhal, "Computer Methods For Circuit Analysis and Design," Van Nostrand Reinhold Publishing, New York, NY, 1983, Chapter 4, "General Formulation Methods," pp. 100–151, Chapter 5, "Sensitivities." pp. 152–170.

Leon O. Chua and Pen–Min Lin, "Computer–Aided Analysis of Electronic circuits: Algorithms and Computational Techniques, ", Prentis–Hall, 1975, Chapter 4, "Nodal Linear Networks Analysis: Algorithms and Computational Methods," pp. 166–203, Chapter 17, "Advanced Algorithms and Computational Techniques for Computer Simulation Programs," pp. 665–717.

* cited by examiner

METHOD AND APPARATUS FOR LIMITED ACCESS CIRCUIT TEST

CROSS REFERENCE TO RELATED APPLICATIONS

A number of related copending United States patent applications commonly owned by the assignee of the present document and incorporated by reference in their entirety into this document are being filed in the United States Patent and Trademark Office on or about Oct. 9, 1998. The list of these applications is as follows: application Ser. No. 09/169,597 filed Oct. 9, 1998, entitled "METHOD AND APPARATUS FOR SELECTING STIMULUS LOCATIONS DURING LIMITED ACCESS CIRCUIT TEST"; application Ser. No. 09/169,777 filed Oct. 9, 1998, entitled "METHOD AND APPARATUS FOR SELECTING TARGETED COMPONENTS IN LIMITED ACCESS TEST"; application Ser. No. 09/169,710 filed Oct. 9, 1998, entitled "METHOD AND APPARATUS FOR CANCELING ERRORS INDUCED BY THE MEASUREMENT SYSTEM DURING CIRCUIT TEST"; application Ser. No. 09/169,421 filed Oct. 9, 1998, entitled "METHOD AND APPARATUS FOR SELECTING TEST POINT NODES FOR LIMITED ACCESS CIRCUIT TEST"; application Ser. No. 09/169,709 filed Oct. 9, 1998, entitled "METHOD AND APPARATUS FOR CORRECTING FOR DETECTOR INACCURACIES IN LIMITED ACCESS TESTING"; and, application Ser. No. 09/169,502 filed Oct. 9, 1998, entitled "METHOD AND APPARATUS FOR BOARD MODEL CORRECTION."

FIELD OF THE INVENTION

This invention relates generally to circuit board testing. More particularly, this invention relates to the identification of manufacturing defects and faulty components on a circuit board.

BACKGROUND OF THE INVENTION

Generally, a circuit board consists of numerous interconnected components such as semiconductor chips, resistors, capacitors, inductors, etc. After circuit boards have been assembled, but before they can be used or placed into assembled products, they must be tested. Testing verifies that the proper components have been used, that each component performs within test limits, that all required electrical connections have been properly completed, and that all necessary electrical components have been attached to the board in the proper position and with the proper orientation. When a component is not performing within test limits, it is said to be faulty.

A common way to test assembled printed circuit boards is called in-circuit test. In-circuit testing involves probing individual board components through a so-called "bed-of-nails" and verifying their existence and specifications independent of surrounding circuitry. A well known series of circuit board testing machines for in-circuit testing is the Hewlett-Packard Company Model HP-3070 Family of Circuit Board Testers. The HP-3070 Family of board testers are fully described in the HP-3070 Family Operating and Service Manuals available from Hewlett-Packard Company. Other families of circuit board testing machines made by Hewlett-Packard are the HP-3060 and HP-3065 series.

To test each individual board component, in-circuit testing requires access to every node on the circuit board. With through-hole parts, access is directly available at component leads. With surface mount parts, access is provided through vias and test pads that are placed on the circuit board when it is designed. Increases in board density, however, have led to a decrease in the size of vias that has eclipsed the ability of probe technology to contact a smaller target. Vias now are often one hundred times smaller in area than vias used just a few years ago. Furthermore, test pads that are large enough to be probed successfully require a substantial amount of board area that would otherwise be used to place and connect components. Therefore, on many circuit boards it is no longer practical, or desirable, to probe every node on the board.

Accordingly, there is a need in the art for a test technique and apparatus that can test individual circuit board components having tolerances without requiring access to every node on the circuit board. Such a technique should be generalized so that it can be used with many different circuits and tolerance ranges. Furthermore, it is desirable that such a system be implemented on existing in-circuit testing hardware to preserve existing capital and process investments in that hardware.

SUMMARY OF THE INVENTION

In a preferred embodiment, the invention provides fault detection and diagnosis of individual circuit board components without requiring access to every node on the circuit board. The invention is generally applicable to all kinds of circuits, includes the ability to handle component tolerances, and may be implemented using existing computer and tester hardware.

An embodiment of the invention takes a model of the circuit board to be tested, and information specifying which nodes are accessible, and generates a set of diagnostic matrices, limits, and patterns.

Measurements taken by the test hardware from the accessible nodes of the circuit board being tested are subtracted from a predefined value and then formed into a vector. This vector is multiplied, in turn, by each of the diagnostic matrices and the results compared to a set of limits corresponding to that diagnostic matrix. If the results of any of these multiplications lies within the corresponding set of limits, then that result is considered to be a zero. Results that do not lie within the corresponding set of limits are considered to be non-zero. If the pattern of zero and non-zero results matches the zero/non-zero pattern for any fault, a fault exists on the circuit board being tested. The match also gives information on which component or components is faulty.

In a preferred embodiment, the limits corresponding to each diagnostic matrix and pattern are calculated using linear programming. The constraint matrix describes the limits on component values that are to be considered within specification (i.e. within tolerance). The objective function is to maximize/minimize the limits as the component values are moved within their specified tolerances.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENTS

Figure 1:
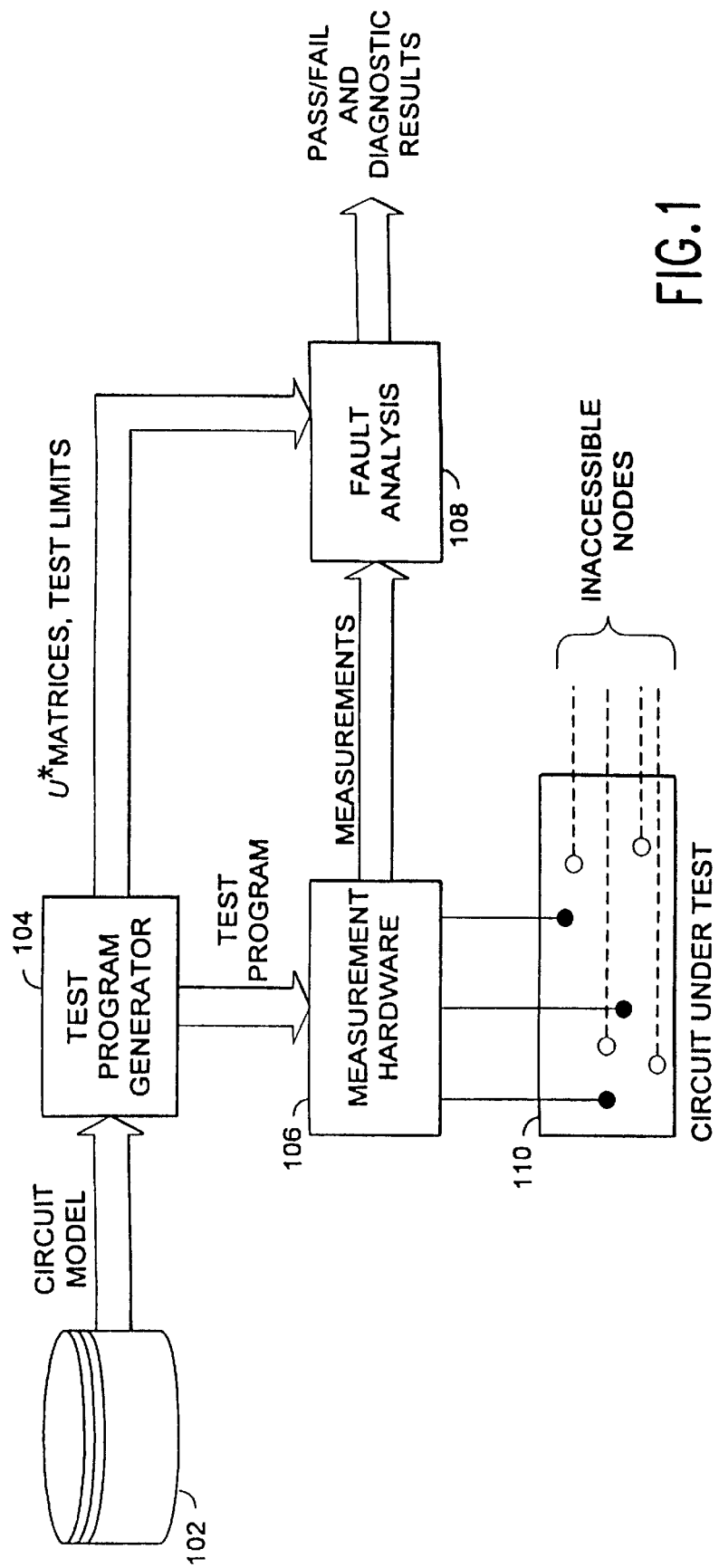
FIG. 1 is a block diagram illustrating the major components involved in limited access testing consistent with an embodiment of the present invention.

Referring to FIG. 1, a database 102 that may be stored on a storage device coupled to a computer is used to feed a model of the circuit to be tested to a test program generator 104. The model contains the information necessary to test the board including component types, component interconnections, component values, component tolerances, and an indication of which circuit nodes are accessible. The test program generator creates a test program that controls the operation of the measurement hardware 106 as it applies stimulus to, and takes measurements on, the circuit under test 110. The results of these measurements, and information provided by the test program generator 104 are used by a fault analysis routine 108 to produce pass/fail and diagnostic information on the circuit under test. The test program generator and the fault analysis routine may be programs or routines that are executed on a computer.

The test program generator 104 or fault analysis routine 108 may be stored in memory on a computer, stored on disk, or any other computer readable medium. They may be part of a single piece of executable code, or they may be separate programs, or routines. Furthermore, they may be executed on the same computer, or they may be run on different pieces of hardware. The hardware implementing the test system shown in FIG. 1 may be a general purpose computing device coupled to the measurement hardware and executing executable code or it may include custom hardware, such as an application specific integrated circuit that integrates one or more of the functions shown.

Figure 2:
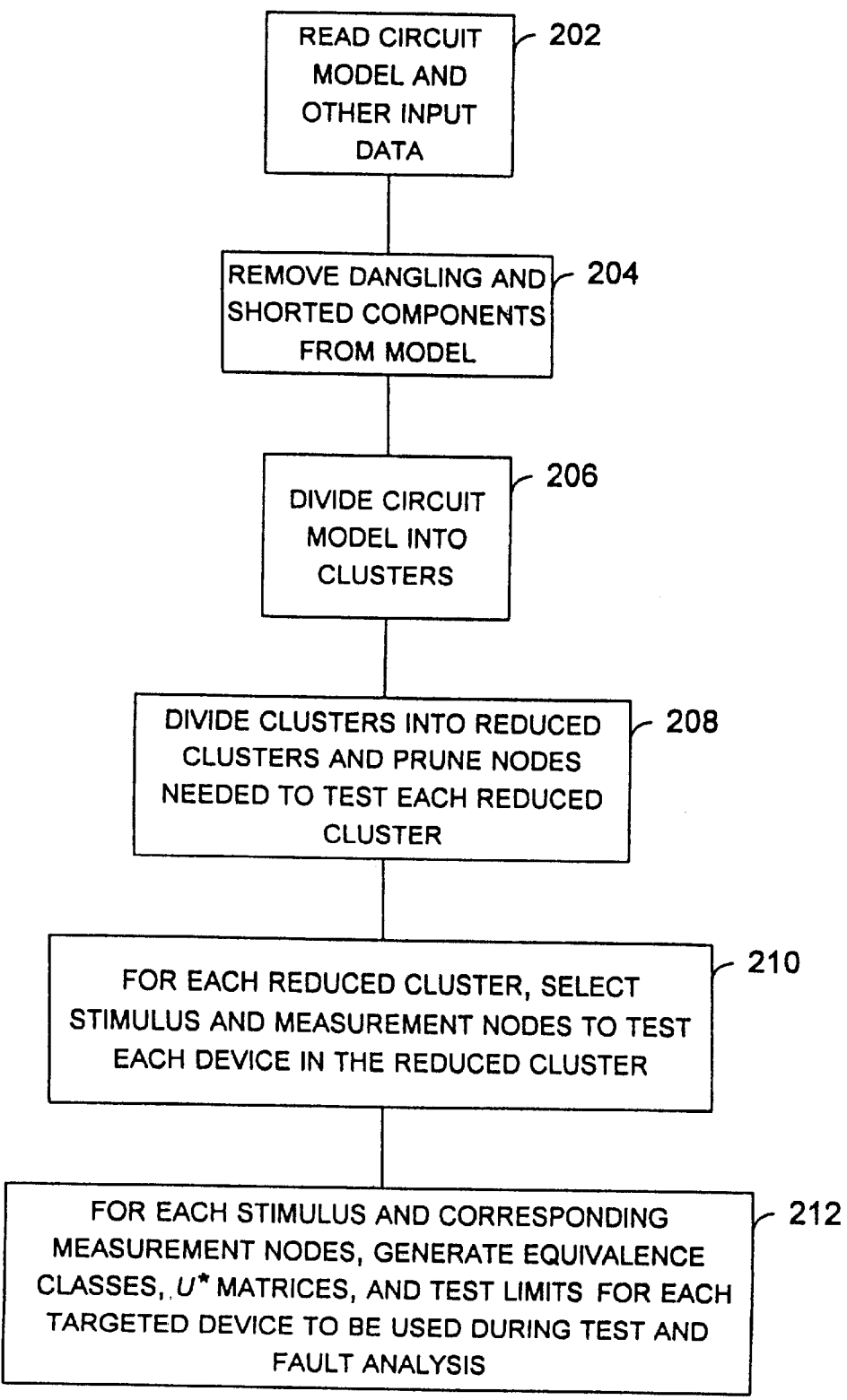
FIG. 2 is a flowchart illustrating generally the major steps taken by the test program generator consistent with an embodiment of the present invention.

FIG. 2 illustrates the major steps taken by the test program generator 108 consistent with an embodiment of the present invention. In a step 202, the test program generator reads the circuit model and any other input data that is necessary, such as which nodes are accessible and the component tolerances. In a step 204, dangling and shorted components are removed from the model. Dangling components are those that cannot be tested because there is no path between any of the accessible nodes that passes through that component. In a step 206 the circuit model is broken down into groups of components that are electrically isolated. These groups of components are called "clusters." A cluster is defined as a group of components that for test purposes is connected to the remainder of the circuitry by zero or one node. In a step 208 each cluster is further broken down into reduced clusters and the nodes needed to test each reduced cluster are pruned. A reduced cluster is a group of targeted components that reduces the size and complexity of the test generation, measurement, and fault analysis problems in succeeding stages of the test process. The process of generating "reduced" or "immediate" clusters and selecting the "test points" for each reduced cluster is described in more detail in another part of this document.

In a step 210, stimulus and measurements nodes are selected to test each component in each reduced cluster. Some stimulus and measurement nodes may be selected to test more than one component. The stimulus and measurements may be optimized for test throughput, test coverage, or some tradeoff between the two.

In a step 212, for each stimulus, corresponding measurement nodes, and desired number of simultaneous faults to be tested, at least one equivalence class, U* matrix, and set of test limits are generated. The terms equivalence class, U* matrix, etc. will be discussed in further detail later. For now, suffice it to say that these terms represent the information that will be used later by the fault analysis routine to provide pass/fail and diagnostic information.

In a preferred embodiment, the process of generating the equivalence classes, U* matrices, and test limits for each stimulus and corresponding measurement nodes operates on a reduced cluster. This process, however, can be applied to much larger groups of components, including the whole board.

As with many testing methodologies, a model of the test circuit must first be constructed. This may be the whole board, or some smaller number of components, such as, for example, a cluster. Likewise, it may involve more than one stimulus and any number of measurement nodes. However, for simplicity and computational efficiency, a preferred embodiment uses a test circuit model that involves the components of only one reduced cluster and the stimulus that is being applied by the tester.

The test circuit model contains information on the tester stimulus, the components, and their interconnection so that the testing methodology has enough information to tell when a component is faulty. Many possible circuit models and formulations exist. Many of these models and formulations are described in *Computer Methods for Circuit Analysis and Design* by Jiri Vlach and Kishore Singhal, Van Nostrand Reinhold Publishing, New York, N.Y., 1983 and *Computer-Aided Analysis of Electronic Circuits, Algorithms and Computational Techniques* by Leon O. Chua and Pen-Min Lin, Prentice-Hall, Englewood Cliffs, N.J., 1975 which are both hereby incorporated herein by reference.

In a preferred embodiment, a Simplified Tableau model will be used. The Simplified Tableau model is given by Equation 1.

$$\begin{bmatrix} K_i & -K_v A^T \\ A & 0 \end{bmatrix} \begin{bmatrix} I_b \\ V_n \end{bmatrix} = \begin{bmatrix} S \\ 0 \end{bmatrix} \quad \text{(EQN. 1)}$$

Where $I_b$ is a column vector representing the branch currents, $V_n$ is a column vector representing the node voltages, A is the reduced incidence matrix, $A^T$ is the transpose of the reduced incidence matrix, $K_i$ and $K_v$ are matrices derived from the branch constitutive equations, and S is the source vector that contains the value of the independent sources. Usually the independent sources are a result of the stimulus applied by the tester hardware. For the purposes of this discussion, n (non-subscripted) is chosen to represent the number of nodes in the circuit and b (non-subscripted) is chosen to represent the number of branches.

The rules for constructing $K_i$ and $K_v$ are straightforward and generally involve setting each element of the $K_i$ and Kmatrices according to a table that relates the type of circuit element (i.e. impedance, admittance, current source, current controlled voltage source, etc.) and its value to the appropriate entries in $K_i$ and $K_v$.

Figure 3:
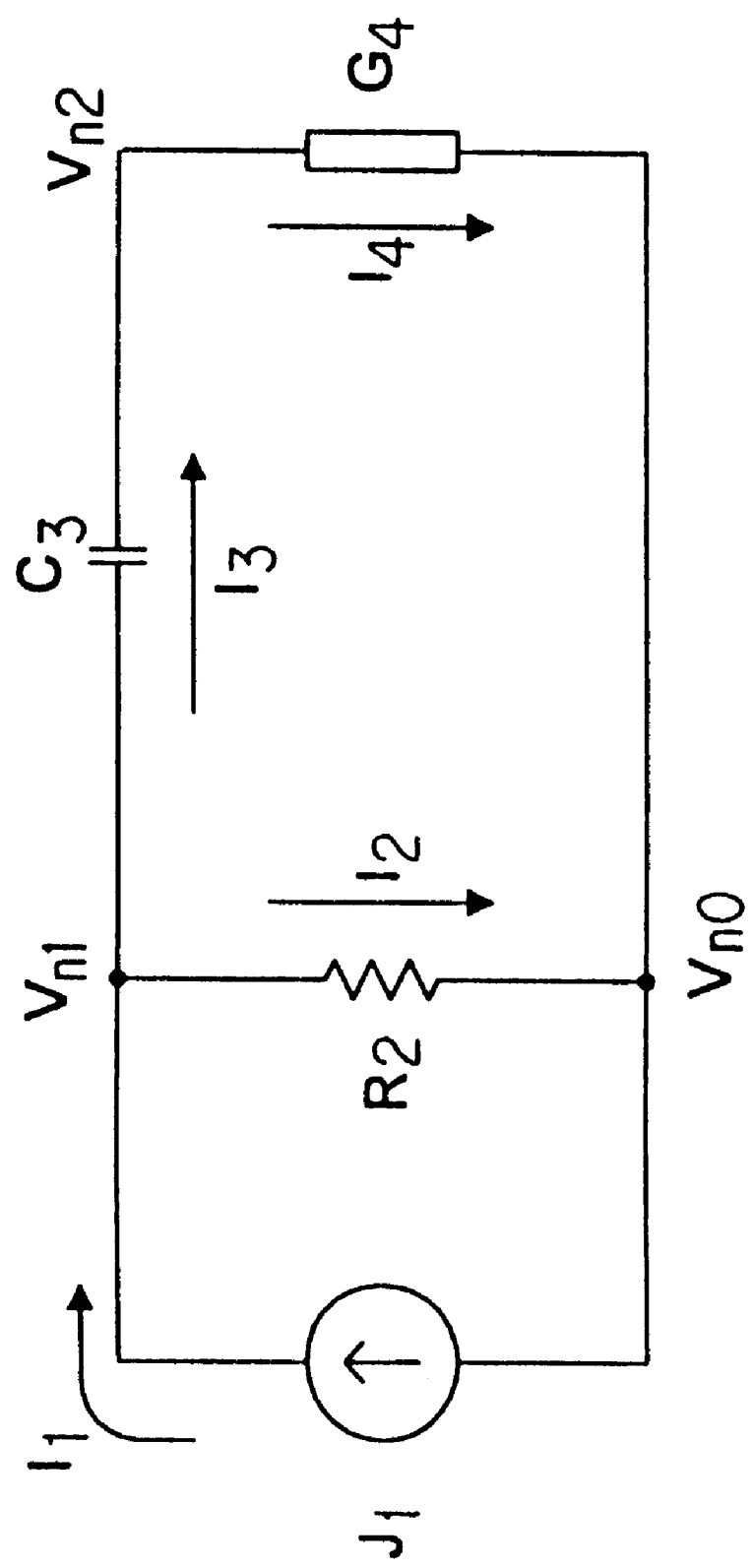
FIG. 3 is a schematic diagram illustrating a circuit that may be modeled by a Simplified Tableau consistent with an embodiment of the present invention.

To illustrate how $K_i$ and $K_v$ may be constructed, examine FIG. 3. FIG. 3 shows a simple circuit with n=3 nodes and b=4 branches consistent with an embodiment of the present invention. This circuit may be the entire board, a cluster, or just the component of a reduced cluster with the tester applied stimulus. $I_b$ will have four currents $I_1$–$I_4$ and $V_n$ will have two node voltages ($V_{n1}$ and $V_{n2}$). Note that there are n-1 node voltages in the $V_n$ vector instead of n node voltages because the node voltages are relative to a reference node. The reference node (usually ground) is often assigned the number 0. The node voltage of the reference node, in FIG. 3, $V_{n0}$, is by definition zero and, as such, need not be included as one of the node voltages.

$K_i$, also known as the impedance matrix, for the network of FIG. 3 can be:

$$K_i = \begin{bmatrix} 1 & & & \\ & R_2 & & \\ & & 1 & \\ & & & 1 \end{bmatrix} \quad \text{(EQN. 2)}$$

$K_v$, also known as the admittance matrix, for the network of FIG. 3 and the $K_i$ of Equation 2 is:

$$K_v = \begin{bmatrix} 0 & & & \\ & 1 & & \\ & & sC_3 & \\ & & & G_4 \end{bmatrix} \quad \text{(EQN. 3)}$$

where s is the Laplace transform variable. Note that by entering the capacitance in admittance form when construct-ing $K_i$ and $K_v$, the s variable is kept in the numerator. To simplify the mathematics if only passive components are present, $K_i$ and $K_v$ may be constructed such that $K_i$ is the identity matrix. This is shown in Equations 4 and 5 as follows:

$$K_i = \begin{bmatrix} 1 & & & \\ & 1 & & \\ & & 1 & \\ & & & 1 \end{bmatrix} \quad \text{(EQN. 4)}$$

$$K_v = \begin{bmatrix} 0 & & & \\ & 1/R_2 & & \\ & & sC_3 & \\ & & & G_4 \end{bmatrix} \quad \text{(EQN. 5)}$$

Finally, the incidence matrix, A, which defines the interconnection of the components for FIG. 3 is:

$$A = \begin{bmatrix} -1 & 1 & 1 & 0 \\ 0 & 0 & -1 & 1 \end{bmatrix} \quad \text{(EQN. 6)}$$

Note that this incidence matrix was constructed such that a branch current flowing into a node is defined as having a negative sign, and a branch current flowing out of a node is defined as having a positive sign. These definitions could be reversed.

By substituting Equations 4–6 into Equation 1, the Simplified Tableau for the network shown in FIG. 3 is obtained:

$$\begin{bmatrix} 1 & & & & 0 & 0 \\ & 1 & & & -1/R_2 & 0 \\ & & 1 & & -sC_3 & sC_3 \\ & & & 1 & 0 & -G_4 \\ \hline -1 & 1 & 1 & 0 & 0 & 0 \\ 0 & 0 & -1 & 1 & 0 & 0 \end{bmatrix} \begin{bmatrix} I_1 \\ I_2 \\ I_3 \\ I_4 \\ V_{n1} \\ V_{n2} \end{bmatrix} = \begin{bmatrix} J_1 \\ 0 \\ 0 \\ 0 \\ 0 \\ 0 \end{bmatrix} \quad \text{(EQN. 7)}$$

Equation 7 may be solved for a particular value of s to determine the node voltages and branch currents. Solving Equation 7 can be done by hand using matrix methods, or by any number of computerized math packages or methods.

One of the ways a tableau equation can be solved for the branch currents ($I_b$) and node voltages ($V_n$) is to compute the inverse of the tableau. In terms of the generalized case given in Equation 1 this would be:

$$\begin{bmatrix} I_b \\ V_n \end{bmatrix} = \begin{bmatrix} K_i & -K_v A^T \\ A & 0 \end{bmatrix}^{-1} \begin{bmatrix} S \\ 0 \end{bmatrix} \quad \text{(EQN. 8)}$$

This inverse can be partitioned such that a submatrix containing only those terms that affect the node voltages ($V_n$) can be extracted. To illustrate:

$$\begin{bmatrix} I_b \\ V_n \end{bmatrix} = \begin{bmatrix} K_i & -K_v A^T \\ A & 0 \end{bmatrix}^{-1} \begin{bmatrix} S \\ 0 \end{bmatrix} = \begin{bmatrix} & \\ \hline Z & \end{bmatrix} \begin{bmatrix} S \\ 0 \end{bmatrix} \quad \text{(EQN. 9)}$$

The Z matrix is composed of n-1 rows and b columns where, once again, n is the number of nodes in the circuit, and b is the number of branches. The extraction of the Z matrix allows the use of the following simple equation to relate node voltages to applied independent sources:

$$V_n = ZS \qquad \text{(EQN. 10)}$$

If each circuit branch in the model has only one component, a property of the Z matrix is that its columns have a one-to-one correspondence to each of the components. This means that composite components, such as an inductor that has both a series resistance and an ideal inductance, should be split into multiple branches to maintain this one-to-one relationship. (i.e. a branch for the resistance and a branch for the inductance.) For example, if the columns of the incidence matrix, A, correspond to the components in FIG. 3 as follows (note that since each branch is a single component, the terms component and branch may be used interchangeably.):

$$A = \begin{matrix} J_1 & R_2 & C_3 & G_4 \\ \begin{bmatrix} -1 & 1 & 1 & 0 \\ 0 & 0 & -1 & 1 \end{bmatrix} \end{matrix}$$

then the Z matrix, which has the same (n-1)xb dimension as the A matrix, would have the same correspondence between its columns. To illustrate:

$$Z = \begin{matrix} J_1 & R_2 & C_3 & G_4 \\ \begin{bmatrix} \vdots & \vdots & \vdots & \vdots \\ \vdots & \vdots & \vdots & \vdots \end{bmatrix} \end{matrix}$$

The Simplified Tableau model describing any circuit whose components each have a single, pre-defined value is given in a generalized way by Equation 1. When component values are changed, (for example, by having a tolerance instead of a single value, or by being faulty) the circuit may be described using this equation:

$$\begin{bmatrix} K_i & -(K_v + \Delta K_v)A^T \\ A & 0 \end{bmatrix} \begin{bmatrix} I_b + \Delta I_b \\ V_n + \Delta V_n \end{bmatrix} = \begin{bmatrix} S \\ 0 \end{bmatrix} \qquad \text{(EQN. 11)}$$

Equation 11 shows that a change in the admittance matrix K, by an amount $\Delta K_v$ results in changes $\Delta I_b$ and $\Delta V_n$ in the branch-current and node-voltage vectors, respectively, for the same stimulus, S. To simplify the math, $K_i$ is kept constant by opting to describe all changes in component values as changes in the admittance matrix $K_v$. For example, if the nominal value of the resistor in FIG. 3 is $R_2$ and it increases from that nominal by 100 Ohms, then:

$$\Delta K_v = \begin{bmatrix} 0 & & & \\ & \left(\frac{1}{R_2} - \frac{1}{R_2 + 100}\right) & & \\ & & 0 & \\ & & & 0 \end{bmatrix} \qquad \text{(EQN. 12)}$$

In the general case, subtracting Equation 1 from Equation 11 gives:

$$\begin{bmatrix} K_i & -K_v A^T \\ A & 0 \end{bmatrix} \begin{bmatrix} \Delta I_b \\ \Delta V_n \end{bmatrix} = \begin{bmatrix} \Delta K_v A^T (V_n + \Delta V_n) \\ 0 \end{bmatrix} \qquad \text{(EQN. 13)}$$

from which:

$$\begin{bmatrix} \Delta I_b \\ \Delta V_n \end{bmatrix} = \qquad \text{(EQN. 14)}$$

$$\begin{bmatrix} K_i & -K_v A^T \\ A & 0 \end{bmatrix}^{-1} \begin{bmatrix} \Delta K_v A^T (V_n + \Delta V_n) \\ 0 \end{bmatrix} =$$

$$\begin{bmatrix} \phantom{|} | \phantom{|} \\ \hline Z \hline \end{bmatrix} \begin{bmatrix} \Delta K_v A^T (V_n + \Delta V_n) \\ 0 \end{bmatrix}$$

Extracting the parts of Equation 14 that affect $\Delta V_n$ gives:

$$\Delta V_n = Z \Delta K_v A^T (V_n + \Delta V_n) \qquad \text{(EQN. 15)}$$

In a preferred embodiment, not all of the nodes of a circuit under test are accessible to the measurement hardware. Therefore, not all of the node voltages can be measured. The rows of the matrices in Equation 15 can be re-arranged and partitioned into changes in node voltages that can be observed, and changes that cannot be observed as follows:

$$\begin{bmatrix} \Delta V_{(n,ac)} \\ \Delta V_{(n,nac)} \end{bmatrix} = \begin{bmatrix} Z_{(ac)} \\ Z_{(nac)} \end{bmatrix} \Delta K_v A^T (V_n + \Delta V_n) \qquad \text{(EQN. 16)}$$

where "ac" designates the set of nodes accessible to the measurement hardware and "nac" designates the non-accessible nodes.

Accordingly, the following equation gives only the observable changes in node voltages:

$$\Delta V_{(n,ac)} = Z_{(ac)} \Delta K_v A^T (V_n + \Delta V_n) \qquad \text{(EQN. 17)}$$

In a preferred embodiment, the terms of this equation are used to generate equivalence classes, U* matrices, and test limits. The process for generating the equivalence classes and U* matrices preferably follows the process taken in the conventional $T_F$-Equivalence class approach. Additional information regarding the $T_F$-Equivalence class approach can be found in "The $T_F$-Equivalence Class Approach to Analog Fault Diagnosis Problems" by Togawa, Matsumoto, and Arai, IEEE TRANSACTIONS ON CIRCUITS AND SYSTEMS, vol. cas-33 no. 10, October 1986.

A rigorous mathematical description of the $T_F$-Equivalence class approach is given in the previously mentioned paper by Togawa, *The $T_F$-Equivalence Class Approach to Analog Fault Diagnosis Problems*, IEEE TRANSACTIONS ON CIRCUITS AND SYSTEMS, vol. cas-33 no. 10 (1986) which is hereby incorporated herein by reference. A simple example based on the circuit shown in FIG. 4 consistent with an embodiment of the present invention will be used to illustrate some concepts of the $T_F$-Equivalence class approach. The circuit of FIG. 4 has only resistances in addition to a source stimulus. However, the same basic methods of the $T_F$-Equivalence class approach may be applied when components have complex impedances.

Figure 4:
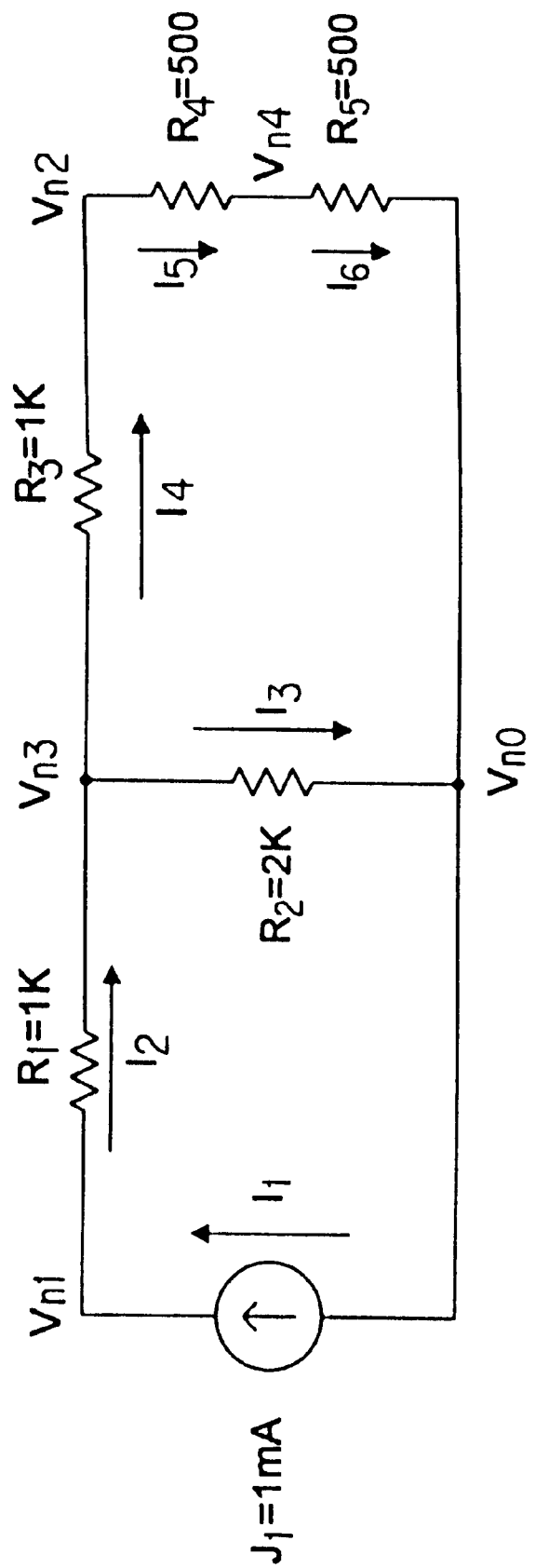
FIG. 4 is a schematic diagram of a circuit that is used to help illustrate a preferred embodiment consistent with an embodiment of the present invention.
Figure 5:
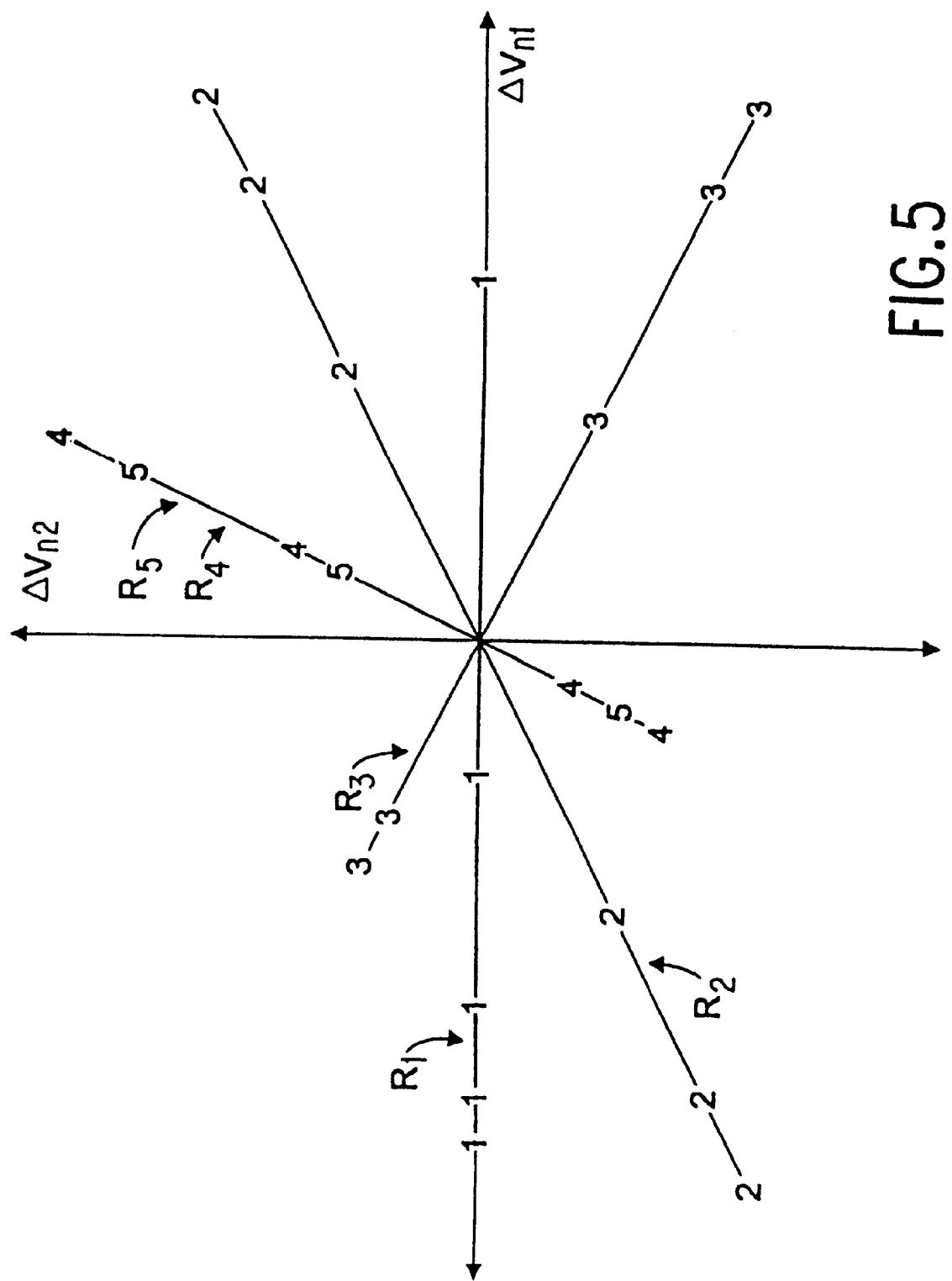
FIG. 5 is a plot of the change in voltage as a single component in the circuit of FIG. 3 is swept through a range of values consistent with an embodiment of the present invention.

Assume that the components in FIG. 4 have nominal values as shown in the figure. Also, assume that the only accessible nodes in addition to the reference node $V_{n0}$, are $V_{n1}$ and $V_{n2}$. If each of the components is held constant at its nominal value except one, and that one component is swept through a large range of values, it produces a line when $\Delta V_{n2}$ is plotted versus $\Delta V_{n1}$. $\Delta V_{n1}$ and $\Delta V_{n2}$ are the changes in $V_{n1}$ and $V_{n2}$ from their nominal values. When this is done for each component in turn, the plot of FIG. 5 which is consistent with an embodiment of the present invention results. In FIG. 5, each line is labeled with the component that was being varied.

This plot helps illustrate the equivalence classes of FIG. 4. Take for example, the case where it is assumed that all components are at their nominal value except for one. First, $V_{n1}$ and $V_{n1}$ are measured on the circuit under test to obtain a $\Delta V_{(n1,test)}$ and $\Delta V_{(n2,test)}$ which are then plotted on FIG. 5. If the location of this point fell on the lines for $R_1$, $R_2$, or $R_3$ it would indicate that corresponding component is the component that is not at its nominal value. If the location of the point fell on the line for $R_4$ and $R_5$, then it would indicate that either, or both, of $R_4$ or $R_5$ is not at its nominal value and that the rest of the components are at their nominal values. Furthermore, if the point does not lie on any of the lines, then it can be concluded that some combination of more than one component being non-nominal has occurred (other that $R_4$ and $R_5$ both being non-nominal).

As shown in FIG. 5, the lines for $R_4$ and $R_5$ overlap. In general then, it is impossible to distinguish the case when $R_4$ is non-nominal from the case when $R_5$ is non-nominal by looking only at the voltages at the accessible nodes $V_{n1}$ and $V_{n2}$. These components are then said to be in the same equivalence class.

The methods of the $T_F$-Equivalence class approach are applicable to higher dimensions. That is to say, to include larger circuits with more accessible nodes, to include complex as well as real voltages measurements, to include multiple components being non-nominal, multiple stimulus, and multiple stimulus frequencies. The foregoing example was limited to only two dimensions, and one non-nominal component at a time, so that it would be easily visualized and could be shown on a two-dimensional plot.

In a preferred embodiment, the equivalence classes may be determined using the elements of the $Z_{(ac)}$ matrix of Equation 17. The construction of the $Z_{(ac)}$ matrix and the equivalence classes is typically done by the test program generator 104 based on the information obtained from database 102 after partitioning the circuit into clusters. For the case when only two nodes are accessible ($V_{n1}$ and $V_{n2}$) the $Z_{(ac)}$ matrix for the circuit shown in FIG. 3 is:

$$Z_{(ac)} = \begin{bmatrix} 1000 & 1000 & 500 & 125 & 375 \\ 0 & 500 & -250 & 187.5 & 562.5 \end{bmatrix} \quad (\text{EQN. 18})$$

where $Z_{(ac)}$ has a column ordering that corresponds to $R_1$, $R_2$, $R_3$, $R_4$, and $R_5$, respectively. A complete list of all the equivalence classes may be constructed by checking whether each combination of elements and groups of elements belong to the same equivalence class and then grouping them accordingly. In general, two groups of components belong to the same equivalence class when it is impossible to distinguish the case when one group has non-nominal components from when the other group has non-nominal components merely by looking at the voltages at the accessible nodes. In more detail, the following procedure may be used to determine if two components, or groups of components, belong in the same equivalence class. The two groups of components are referred to as f1 and f2, respectively, and each may be comprised of one or more components being non-nominal.

1. Assemble a matrix from the columns of the $Z_{(ac)}$ matrix corresponding to the first group ($Z_{(ac,f1)}$). Calculate its rank, rank($Z_{(ac,f1)}$).
2. Assemble a matrix from the columns of the $Z_{(ac)}$ matrix corresponding to the second group ($Z_{(ac,f2)}$). Calculate its rank, rank($Z_{(ac,f2)}$).
3. Assemble a matrix from the columns of the $Z_{(ac)}$ matrix corresponding to the union of the first group and the second group ($Z_{(ac,f1 \cup f2)}$). Calculate its rank, rank($Z_{(ac,f1 \cup f2)}$).
4. If and only if rank($Z_{(ac,f1)}$)=rank($Z_{(ac,f2)}$)=rank($Z_{(ac,f1 \cup f2)}$) do the groups f1 and f2 belong to the same equivalence class.

Using f1={$R_1$} and f2={$R_2$} as an example:

1. $Z_{(ac,f1)} = \begin{bmatrix} 1000 \\ 0 \end{bmatrix}$ rank($Z_{(ac,f1)}$) = 1

2. $Z_{(ac,f2)} = \begin{bmatrix} 1000 \\ 500 \end{bmatrix}$ rank($Z_{(ac,f2)}$) = 1

3. $Z_{(ac,f1 \cup f2)} = \begin{bmatrix} 1000 & 1000 \\ 0 & 500 \end{bmatrix}$ rank($Z_{(ac,f1 \cup f2)}$) = 2

4. Since rank($Z_{(ac,f1 \cup f2)}$)≠rank($Z_{(ac,f1)}$)=rank($Z_{(ac,f2)}$) then $R_1$ and $R_2$ do not belong to the same equivalence class.

Another example, this time with f1={$R_1 R_4$} and f2={$R_1 R_5$}:

1. $Z_{(ac,f1)} = \begin{bmatrix} 1000 & 125 \\ 0 & 187.5 \end{bmatrix}$ rank($Z_{(ac,f1)}$) = 2

2. $Z_{(ac,f2)} = \begin{bmatrix} 1000 & 375 \\ 0 & 562.5 \end{bmatrix}$ rank($Z_{(ac,f2)}$) = 2

3. $Z_{(ac,f1 \cup f2)} = \begin{bmatrix} 1000 & 125 & 1000 & 375 \\ 0 & 187.5 & 0 & 562.5 \end{bmatrix}$ rank($Z_{(ac,f1 \cup f2)}$) = 2

4. Since rank($Z_{(ac,f1)}$)=rank($Z_{(ac,f2)}$)=rank($Z_{(ac,f1 \cup f2)}$) the groups f1={$R_1 R_4$} and f2={$R_1 R_5$} belong to the same equivalence class.

In a preferred embodiment, a mathematically and computationally advantageous method of checking whether a point lies in the space of an equivalence class in an arbitrary number of dimensions is used. This allows a set of measurements at the accessible nodes to be used to determine which equivalence class contains the components or components that are non-nominal for an arbitrary number of accessible nodes.

The procedure to find the equivalence classes (if any) that contain non-nominal components, which is also used by the $T_F$-Equivalence class approach, is summarized as follows:

1. Select one member of an equivalence class. For clarity, f1 will represent the group of components in the member of the equivalence class, and $\mathfrak{S}$ will represent the equivalence class. Therefore, f1 is a member of $\mathfrak{S}$. Assemble a matrix from the columns of the $Z_{(ac)}$ matrix corresponding to the components in this group. ($Z_{(ac,f1)}$).
2. Use the Singular Value Decomposition ("SVD") to factor the matrix from step 1 into three terms. SVD ($Z_{(ac,f1)}$)=$U_{(ac,f1)} \Sigma_{(ac,f1)} W^T_{(ac,f1)}$. (Note: the SVD is commonly written as the matrix product of the three terms, U, $\Sigma$, and $V^T$ where U is the matrix containing the left singular vectors, $\Sigma$, is the matrix containing singular values, and V is the matrix containing the right singular vectors. Unfortunately, the variable V has been chosen to mean voltage in the preceding discussions. Therefore, this discussion will use the variable W to represent the right singular matrix. Also note that the rank of $Z_{(ac,f1)}$ is easily obtained from SVD($Z_{(ac,f1)}$).)
3. Generate the conjugate transpose of $U_{(ac,f1)}$, $U^*_{(ac,f1)}$. (Note that since $U_{(ac,f1)}$ is unitary, the conjugate transpose of $U_{(ac,f1)}$ is the same as the inverse and the adjoint of $U_{(ac,f1)}$.)
4. Generate $\Delta V_{(n,ac,meas)}$ by subtracting the voltages expected at the accessible nodes if all the components are at their nominal value from the voltages measured at the accessible nodes.

5. Multiply $U^*_{(ac,f1)}$ and $\Delta V_{(n,ac,meas)}$.

6. If the first r elements (rows) of $U^*_{(ac,f1)}\Delta V_{(n,ac,meas)}$ are non-zero, and the rest are zero, then the equivalence class $\mathcal{S}$ of which f1 is a member, contains the group of components that are non-nominal. The variable r represents the maximum number of simultaneously non-nominal (or faulty) components that is being checked. (r also equals rank($Z_{(ac,f1)}$).) If the group of components f1 is only one member of $\mathcal{S}$ then all of the components in f1 are non-nominal.

7. If the first r elements (rows) of $U^*_{(ac,f1)}\Delta V_{(n,ac,meas)}$ are not all non-zero, or any of the rest of the elements are non-zero, then the equivalence class $\mathcal{S}$ of which f1 is a member, does not contain the group of components that are non-nominal. Accordingly, steps 1–6 should be repeated for each equivalence class, in turn, until one is found that contains the non-nominal group of components or all the equivalence classes are exhausted.

In a preferred embodiment, steps 1–3, above, are typically performed just once for each equivalence class and the resulting $U^*_{(ac,f1)}$, $U^*_{(ac,f2)}$ ... etc. matrices are typically stored for use in step 5. Step 4 is usually performed once for each circuit tested. Additionally, steps 5 and 6 are typically repeated successively for each equivalence class until the an equivalence class (if any) is found that contains the group of components that are non-nominal on the circuit being tested. No equivalence class may be found if there are more simultaneously non-nominal components than were considered when the equivalence classes were constructed.

On many circuits, components are not confined to a single nominal value to be considered non-faulty. This range of component values is referred to as tolerance. In a preferred embodiment, to cope with component tolerances, the zero/non-zero determination in step 6, above, is governed by the following equation:

$$\gamma_{(ac,f,min)} \leq U^*_{(ac,f)}\Delta V_{(n,ac,meas)} \leq \gamma_{(ac,f,max)} \qquad \text{(EQN. 19)}$$

In other words, if a particular element of $U^*_{(ac,f)}\Delta V_{(ac,test)}$ is greater than or equal to the $\gamma_{(ac,f,min)}$ (for that particular element and that particular fault "f") and $U^*_{(ac,f)}\Delta V_{(ac)}$ is less than or equal to the $\gamma_{(ac,f,max)}$ (for that particular element and that particular fault "f"), then it should be considered a zero. Otherwise, it should be considered non-zero. "Considering" a particular element of $U^*_{(ac,f)}\Delta V_{(n,ac,meas)}$ zero/non-zero allows the tests of steps 6 and 7, above, to be accomplished in the case where components have tolerances. However, by allowing a range of values for each element of $U^*_{(ac,f)}\Delta V_{(n,ac,meas)}$ to be considered zero/non-zero, more than one equivalence class may satisfy the test of step 6 and be identified as containing a member whose components are out-of-tolerance. Nevertheless, the search for the out-of-tolerance components should be considerably narrowed since only one equivalence class truly has a member whose components are out-of-tolerance.

If $U^*\Delta V_{(n,ac,meas)}$ involves complex numbers, the real and imaginary parts must both satisfy limits to be considered a zero. The zero/non-zero determination is governed by the following set of equations:

$$\gamma_{(ac,f,real,min)} \leq \text{real}(U^*_{(ac,f)}\Delta V_{(n,ac,meas)}) \leq \gamma_{(ac,f,real,max)}$$

$$\gamma_{(ac,f,imag,min)} \leq \text{imag}(U^*_{(ac,f)}\Delta V_{(n,ac,meas)}) \leq \gamma_{(ac,f,imag,max)} \qquad \text{(EQN. 20)}$$

In both Equations 19 and 20, the $\gamma$ terms are vectors with individual elements that each correspond to a row of $U^*$. The functions real( ) and imag( ) extract the real and imaginary parts, respectively, from the input vector.

In an exemplary embodiment, any method that will minimize and maximize a function is sufficient to calculate each element of the $\gamma$ vectors. In a preferred embodiment, the method used to calculate the $\gamma$ vectors is based on linear programming (LP). One matrix formulation of an LP model is called a standard-form LP and is characterized by:

$$\min(\text{or max}) \; cx$$

$$\text{subject to } Dx=b, \; x \geq 0.$$

To construct the constraint matrix, D, the tolerance on the elements of $K_v$ can be viewed as a tolerance on the real portion of the complex values and a tolerance on the imaginary portion. If only one portion exists (e.g. in the case of a resistor, the corresponding value in $K_v$ is a real number, and for a capacitor, the value has only an imaginary portion), the tolerance on the other portion is zero. Since linear programming has the implicit constraint that all decision variables are required to be greater than or equal to zero, the tolerance on the real portions of K, can be described by:

$$\text{real}(K_v) = X_{real} + \text{real}(\min K_v) = \text{real}(\overrightarrow{\max}K_v) - Y_{real}$$

$$X_{real} + Y_{real} = \text{real}(\overrightarrow{\max}K_v) - \text{real}(\min K_v).$$

Similarly, the imaginary portions of $K_v$ can be described by:

$$X_{imag} + Y_{imag} = \text{imag}(\max K_v) - \text{imag}(\min K_v).$$

The above equations may then be written as follows:

$$\left[\begin{bmatrix} 1 & 0 & \cdots & \cdots & 0 & 1 & 0 & \cdots & 0 & 0 \\ 0 & 1 & 0 & \cdots & 0 & 0 & 1 & 0 & \cdots & 0 \\ \vdots & \ddots & \vdots & \vdots & \vdots & \vdots & \ddots & \vdots & \vdots & \vdots \\ 0 & \cdots & 0 & 1 & 0 & 0 & \cdots & 0 & 1 & 0 \\ 0 & \cdots & 0 & 0 & 1 & 0 & \cdots & 0 & 0 & 1 \end{bmatrix} \quad 0 \quad\quad\quad 0 \quad\quad\quad \begin{bmatrix} 1 & 0 & \cdots & \cdots & 0 & 1 & 0 & \cdots & 0 & 0 \\ 0 & 1 & 0 & \cdots & 0 & 0 & 1 & 0 & \cdots & 0 \\ \vdots & \ddots & \vdots & \vdots & \vdots & \vdots & \ddots & \vdots & \vdots & \vdots \\ 0 & \cdots & 0 & 1 & 0 & 0 & \cdots & 0 & 1 & 0 \\ 0 & \cdots & 0 & 0 & 1 & 0 & \cdots & 0 & 0 & 1 \end{bmatrix}\right] \begin{bmatrix} X_{real,1} \\ \vdots \\ X_{real,b} \\ Y_{real,1} \\ \vdots \\ Y_{real,b} \\ X_{imag,1} \\ \vdots \\ X_{imag,b} \\ Y_{imag,1} \\ \vdots \\ Y_{imag,b} \end{bmatrix} = \begin{bmatrix} \begin{bmatrix} \text{real}(\max K_{v,11}) - \text{real}(\min K_{v,11}) \\ \text{real}(\max K_{v,22}) - \text{real}(\min K_{v,22}) \\ \vdots \\ \text{real}(\max K_{v,bb}) - \text{real}(\min K_{v,bb}) \end{bmatrix} \\ \begin{bmatrix} \text{imag}(\max K_{v,11}) - \text{imag}(\min K_{v,11}) \\ \text{imag}(\max K_{v,22}) - \text{imag}(\min K_{v,22}) \\ \vdots \\ \text{imag}(\max K_{v,bb}) - \text{imag}(\min K_{v,bb}) \end{bmatrix} \end{bmatrix} \qquad \text{(EQN. 21)}$$

Note that the above equation 21 has the form Dx=b which matches the form of the constraints in a standard-form LP.

The objective function to be optimized corresponds to each row of the right-hand side of the following equation derived from Equation 17:

$$U^*_{(ac,f)} \Delta V_{(n,ac)} = U^*_{(ac,f)} Z_{(ac)} \Delta K_v A^T (V_n + \Delta V_n) = [U^*_{(ac,f)} Z_{(ac)}][\text{diag}(A^T(V_n + \Delta V_n))][\text{vect}(\Delta K_v)] \quad \text{(EQN. 22)}$$

Here the diag( ) function transforms a vector into a diagonal matrix where the diagonal elements are the vector elements and the rest of the elements are zero. The vect( ) function takes the elements along the diagonal of a diagonal matrix and transforms them into a vector. This has the form cx where $\Delta K_v$ is the decision variable. Written in terms of $X_1$ (the real part) and $X_2$ (the imaginary part) of $\Delta K_v$, and $E_1$ (the real part) and $E_2$ (the imaginary part) of the rest of Equation 22 results in:

$$[U^*_{(ac,f)}][Z_{(ac)}][\text{diag}(A^T(V_n+\Delta V_n))] \begin{bmatrix} X_{real,1} + jX_{imag,1} \\ X_{real,2} + jX_{imag,2} \\ X_{real,3} + jX_{imag,3} \\ \vdots \\ X_{real,b} + jX_{imag,b} \end{bmatrix} = \quad \text{(EQN. 23)}$$

$$(E_{real} + jE_{imag})(X_{real} + jX_{imag}) =$$
$$(E_{real}X_{real} - E_{imag}X_{imag}) + j(E_{real}X_{imag} + E_{imag}X_{real})$$

By separating Equation 23 into its real and imaginary components, two objective functions are obtained. One objective function is for the real part of Equation 23, and one is for the imaginary part. Each of these objective functions needs to be minimized and maximized independently. The objective functions are:

$$H_{real} = [\, E_{real} \quad 0 \quad -E_{imag} \quad 0 \,] \begin{bmatrix} X_{real,1} \\ X_{real,2} \\ \vdots \\ X_{real,b} \\ Y_{real,1} \\ Y_{real,2} \\ \vdots \\ Y_{real,b} \\ X_{imag,1} \\ X_{imag,2} \\ \vdots \\ X_{imag,b} \\ Y_{imag,1} \\ Y_{imag,2} \\ \vdots \\ Y_{imag,b} \end{bmatrix} \quad \text{(EQN. 24)}$$

and $$H_{imag} = [\, E_{imag} \quad 0 \quad E_{real} \quad 0 \,] \begin{bmatrix} X_{real,1} \\ X_{real,2} \\ \vdots \\ X_{real,b} \\ Y_{real,1} \\ Y_{real,2} \\ \vdots \\ Y_{real,b} \\ X_{imag,1} \\ X_{imag,2} \\ \vdots \\ X_{imag,b} \\ Y_{imag,1} \\ Y_{imag,2} \\ \vdots \\ Y_{imag,b} \end{bmatrix} \quad \text{(EQN. 25)}$$

Figure 6:
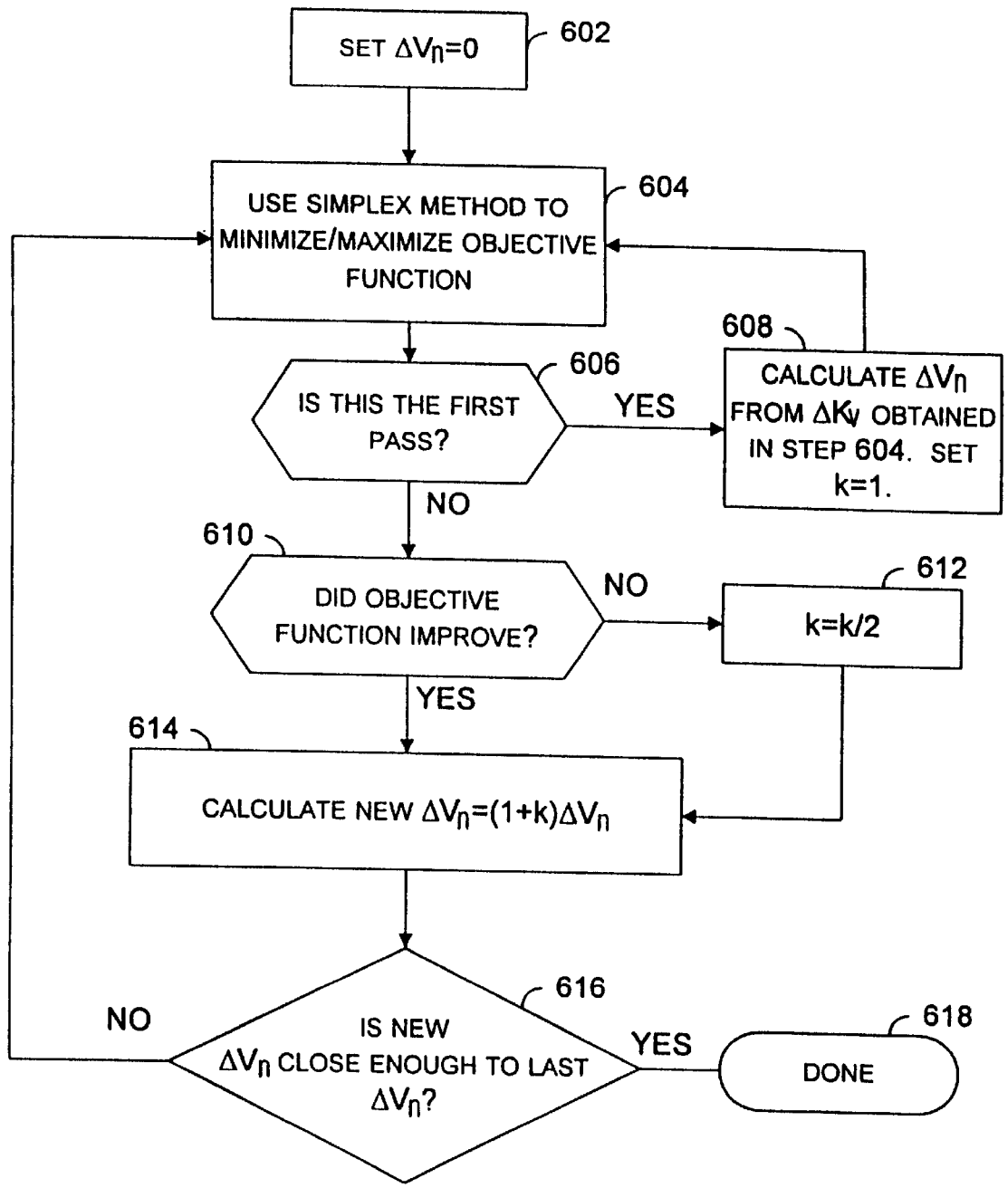
FIG. 6 is a flow chart illustrating the steps to optimize the objective function used to find test limits consistent with an embodiment of the present invention.

These functions are non-linear because both $\Delta K_v$ and $\Delta V_n$ are unknown. This can be solved by appropriately assigning values for the elements in $\Delta V_n$ and then optimizing to find a $\Delta K_v$. FIG. 6 is a flow chart illustrating the steps to optimize the objective function consistent with an embodiment of the present invention. In a step 602, the process is initiated by setting $\Delta V_n$ to zero. In a step 604, the objective function is optimized using the currently assigned value of $\Delta V_n$ and the conventional Simplex method. This optimization may be a minimization or a maximization depending on whether $\gamma_{(ac,f,min)}$ or $\gamma_{(ac,f,max)}$, respectively, is being computed. In a step 606, if this is the first pass (i.e. $\Delta V_n$ is zero) then the process proceeds to step 608. If it is not the first pass, then the process continues on to step 610. In a step 608, $\Delta V_n$ is calculated from the $\Delta K_v$ found in step 604. The process then loops back to step 604 to optimize the objective function with the new $\Delta V_n$.

In a step 610, if the objective function optimized in step 604 improved from the last pass, the process continues on to step 614. If the objective function did not improve from the last pass, k is divided by two in step 612 and then the process continues on to step 614. In a step 614 a new $\Delta V_n$ is calculated as $\Delta V_n \leftarrow (1+k)\Delta V_n$. In a step 616, a check is made to see how close the new $\Delta V_n$ is to the last $\Delta V_n$. If the new $\Delta V_n$ is close enough, for example 1%, then the process terminates in a step 618. If the new $\Delta V_n$ is not close enough, then the process loops back to step 604 to optimize the objective function again with the new $\Delta V_n$.

The steps in FIG. 6 constitute a search method that finds a $\Delta V_n$ that produces the most optimized objective function. In this case, it is a bisection search. Other search methods could also be used. Examples of types of searches that could be used are the Fibonacci search, the Golden Section search, and the Dichotomus search. Other types of searches that could be used are detailed in *Algorithms* by R. Sedgewick, Addison-Wesley, Reading Mass., 1988.

Once the algorithm terminates with a $\Delta K_v$ that either minimizes or maximizes the objective function, the real and imaginary $\gamma_{(ac,f,min)}$ and $\gamma_{(ac,f,max)}$ may be obtained from the optimization routine, or may be computed from $\Delta K_v$ and the last $\Delta V_n$ using the following equation derived from the objective function:

$$\gamma_{(ac,f)} = U^*_{(ac,f)} \Delta V_{(n,ac)} = U^*_{(ac,f)} Z_{(ac)} \Delta K_v A^T (V_n + \Delta V_n) \quad \text{(EQN. 26)}$$

Figure 7:
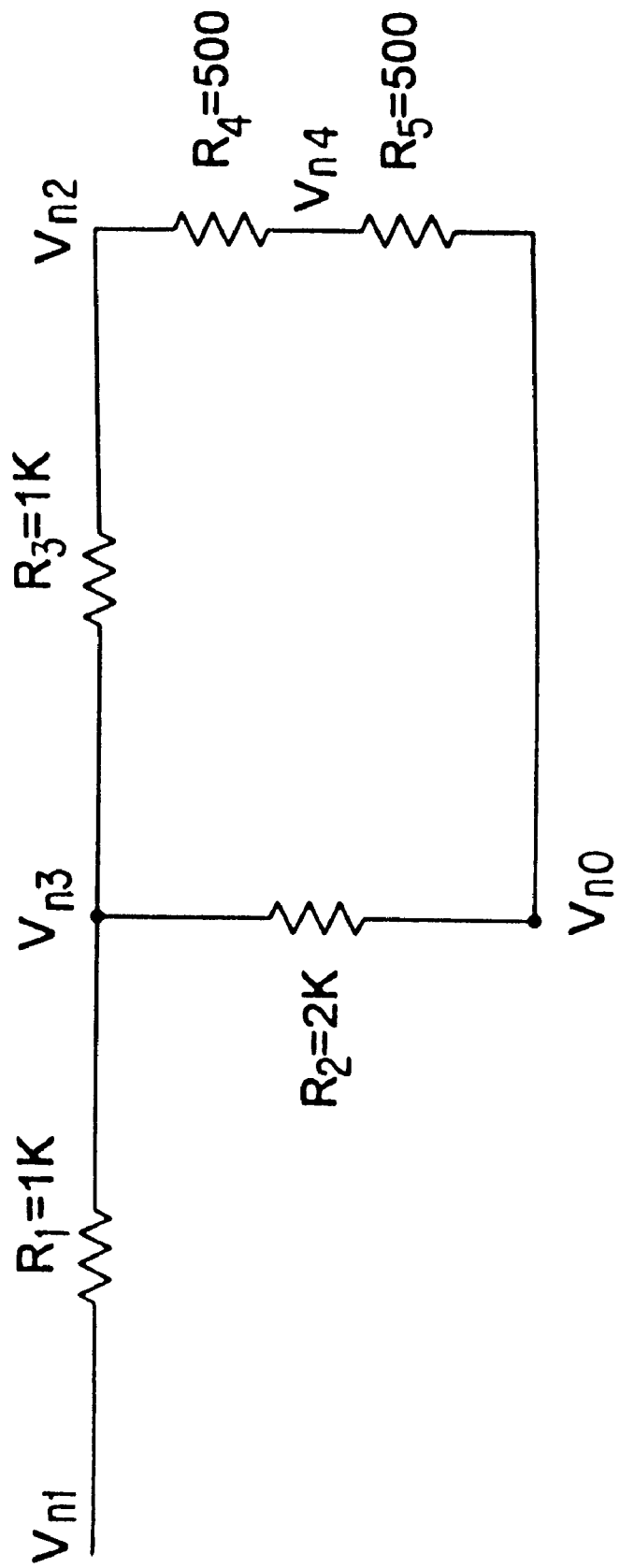
FIG. 7 is a schematic diagram of an example reduced cluster consistent with an embodiment of the present invention.
Figure 8:
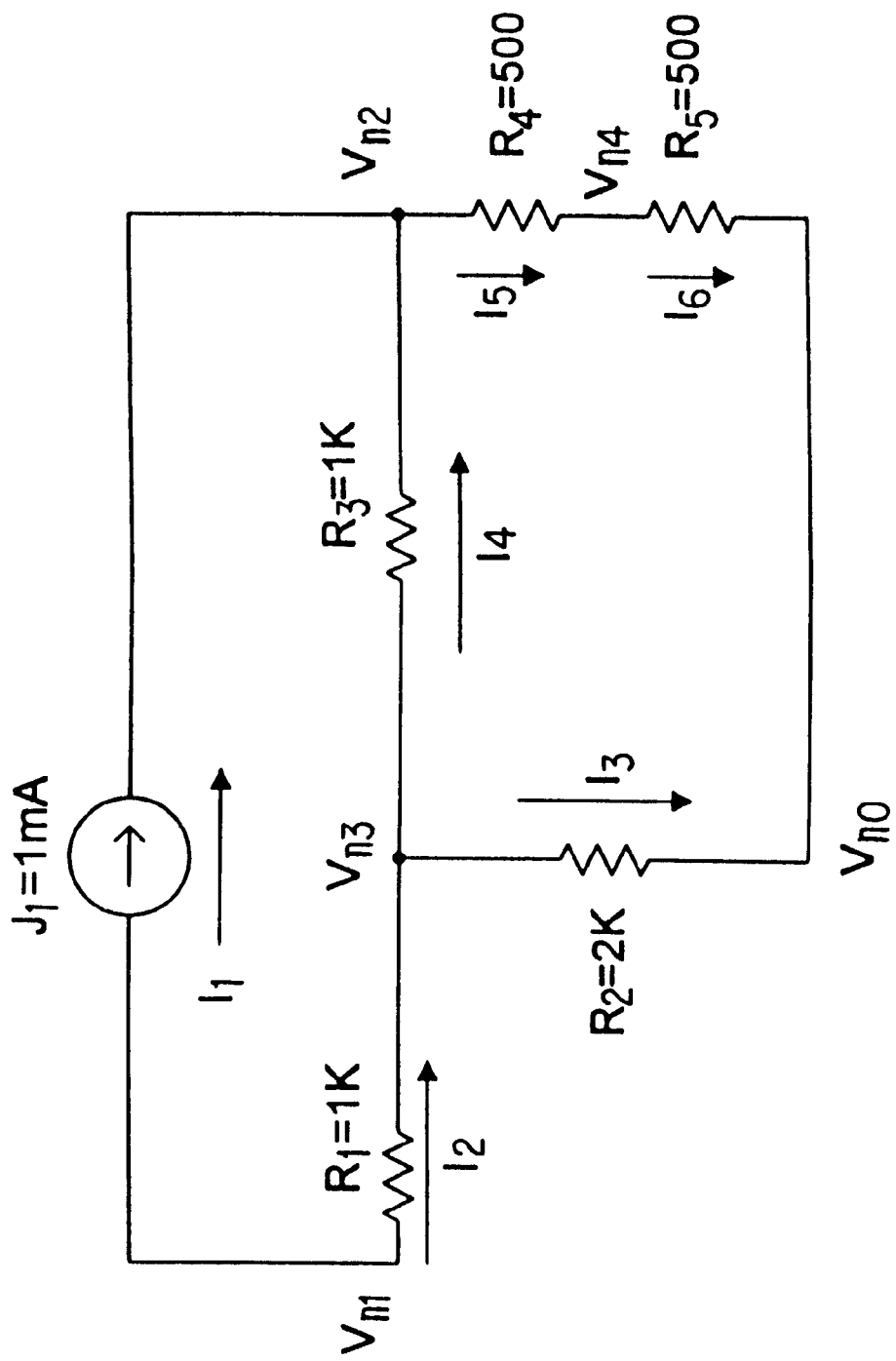
FIGS. 8 and 9 are schematic diagrams of the reduced cluster of FIG. 7 showing stimulus in different locations consistent with an embodiment of the present invention.
Figure 9:
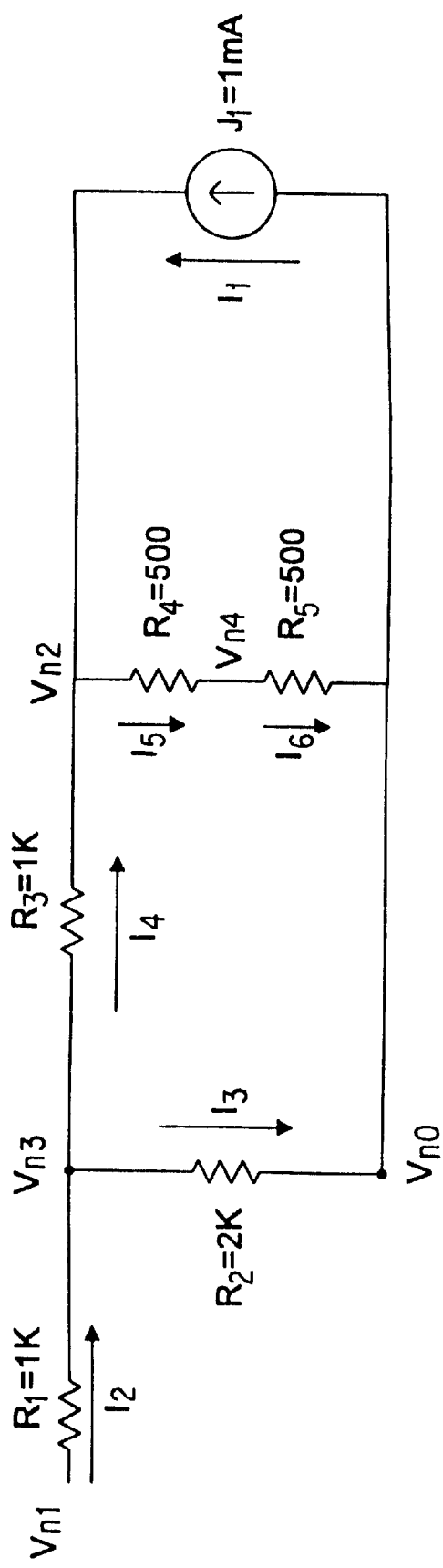

Referring back to FIG. 2, in a step 210 stimulus and measurement nodes are selected to test each component in the reduced cluster. This process of selecting stimulus and measurement nodes could be performed on larger groups of components including clusters or the whole circuit. However, in a preferred embodiment the process of selecting uses the components in a reduced cluster to improve efficiency and reduce complexity. To illustrate the process of selecting stimulus and measurement nodes take FIG. 7 to be an example reduced cluster. FIG. 7 shows the circuit of FIG. 4 with the current source as provided by the test hardware, $J_1$, removed consistent with an embodiment of the present invention. In the example illustrated in FIG. 7, nodes $V_{n0}$, $V_{n1}$ and $V_{n2}$ are once again the only accessible nodes. FIG. 4 illustrates just one of three possible stimulus locations that could have been chosen. The other two are illustrated in FIG. 8 and FIG. 9 consistent with an embodiment of the present invention. Note how in FIG. 4 and FIG. 8 current will flow through $R_1$, but in FIG. 9 no current will flow through $R_1$. Clearly, the stimulus location shown in FIG. 9 should not be selected to try to test $R_1$.

Figure 10:
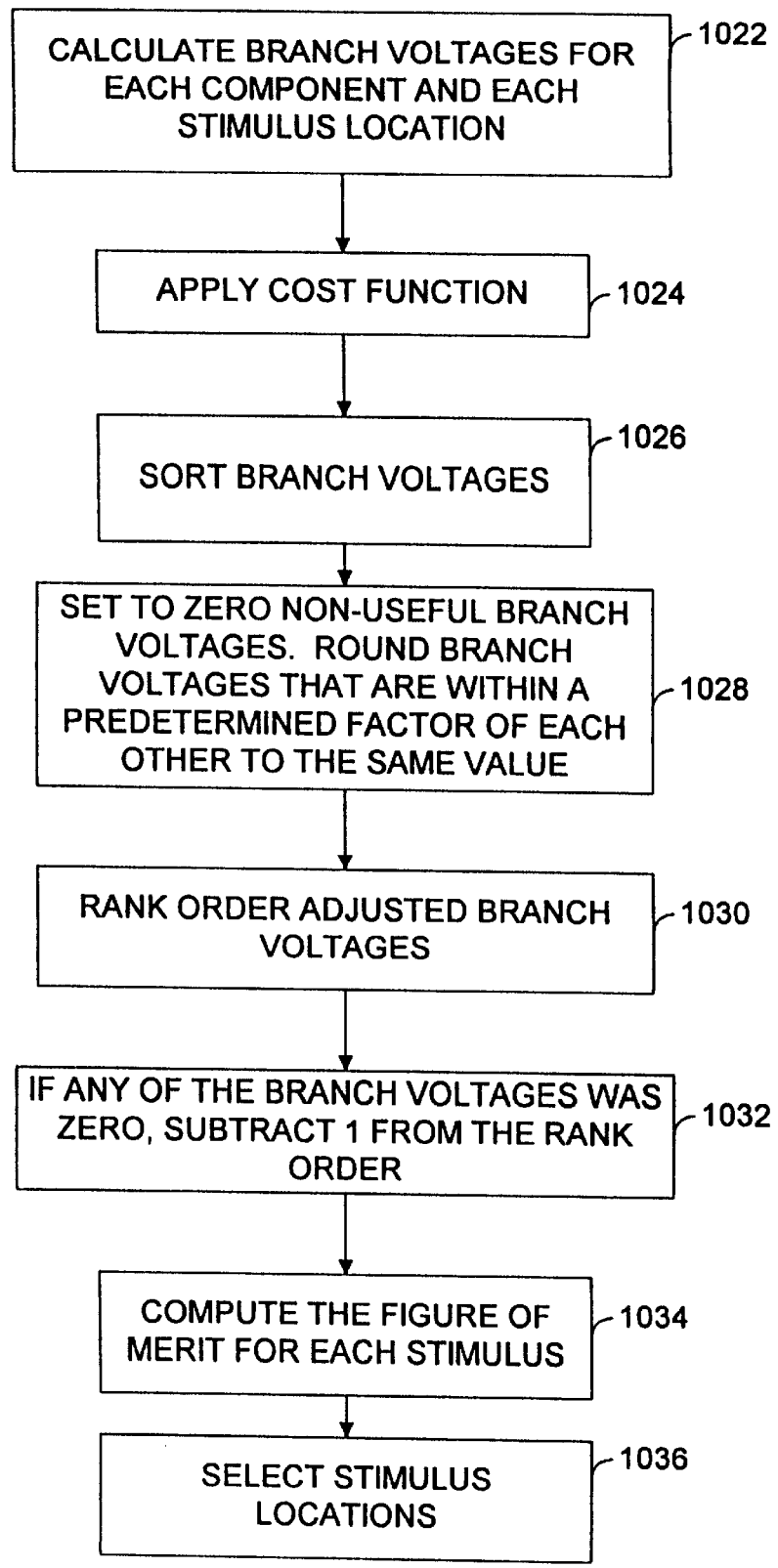
FIG. 10 is a flowchart illustrating a process of generating a figure of merit for various stimulus consistent with an embodiment of the present invention.

To test a component, it is desirable to maximize the voltage across that component. This maximizes the dependence of at least one node voltage on the component value. A process for choosing stimulus that maximizes the branch voltage across a component is illustrated in FIG. 10 consistent with an embodiment of the present invention.

In a step 1022, the branch voltages for each component are calculated for each stimulus location. In a step 1024, a cost function is applied to the branch voltages. A cost function might be used to reduce (or increase) the desirability of some stimulus over others. For example, voltage measurements at lower frequencies take longer because the measurement interval needs to include the period (or fraction thereof) of the applied frequency. To accommodate a cost function, the node voltage values of various stimulus may be multiplied by appropriate numbers. Multiplication by a positive number less than one lowers the desirability of that stimulus. Multiplication by positive numbers greater than 1 increases the desirability of that source.

In a step 1026, the magnitude of the branch voltage values are sorted and duplicate values are eliminated. In a preferred embodiment, they are sorted from smallest to largest. In a step 1028, non-useful branch voltages are set to zero. Also in step 1028, branch voltages that are within a predetermined factor of each other are rounded to the same value. A branch voltage across a device is only considered useful if a change in that voltage is detectable between when the device has its minimum value and when the device has its maximum value. For example, a change in voltage may only be detectable if it is greater than 1 microvolt. Branch voltages that may result in changes between a devices minimum and maximum value being undetectable may be assigned a zero rank order number, or equivalently, set to zero before rank ordering. This helps take into account the tester hardware's measuring accuracy by treating branch voltages that may not result in detectable changes as "no-current" branches.

Finally, branch voltages that are within a predetermined factor of each other may be rounded to the same number or assigned the same rank order. In a preferred embodiment, branch voltages that are within a factor of two are rounded to the same number before rank ordering. This rounding helps reduce the number of stimuli selected.

In a step 1030, each branch voltage value is then assigned a rank order number. In a preferred embodiment, the rank order number is assigned starting at zero with the smallest branch voltage and incrementing by one for each different branch voltage value. However, this choice is arbitrary. Many other ranking schemes such as a descending rank order, or incrementing by a different positive or negative number could be used as long as appropriate adjustments were made in later steps when determining which stimulus to use.

In a step 1032, if any of the branch voltages was zero, then one is subtracted from all the rank order numbers. In a step 1034, a figure of merit is assigned to each stimulus location. The figure of merit is typically assigned by replacing the branch voltage value across each component with the corresponding rank order number and then summing the rank order numbers for every component.

In a step 1036, the stimulus location or locations are selected. The stimulus locations may be chosen according to a variety of criteria based on the information developed in the preceding steps. For example, if maximum branch voltages are desired, the following process may be used:

1. Eliminate any stimulus locations that do not have the highest rank order number for at least one component.
2. Select the stimulus location with the highest figure of merit.
3. Eliminate from consideration those components that the selected stimulus location has the highest rank order number for that component.
4. Eliminate the selected stimulus from consideration.
5. Repeat steps 1–4 until there are no more components under consideration.

A way of selecting the stimulus locations to maximize test throughput may be to first select the stimulus (if any) with the highest figure of merit that did not have any components with a zero rank order number. If there was no stimulus location that did not have at least one component with a zero rank order number, the stimulus with the highest figure of merit would be selected and all the components with non-zero rank order numbers eliminated from consideration. Then another stimulus location could be selected and the process repeated until there were no more components under consideration.

A third way of selecting stimulus locations would be to balance maximizing branch voltages with test throughput. This may be accomplished by adding one stimulus at a time until a desired measure of coverage and/or measure of time is achieved. This balance can be left to the user, or selected through an automated set of rules.

An example of the processes in FIG. 10 follows. For simplicity, the stimulus location shown in FIG. 4 will be referred to as $\sigma_{n1,n0}$ since the stimulus is between nodes $V_{n1}$ and $V_{n2}$. Likewise, the stimulus location shown in FIG. 8 will be referred to as $\sigma_{n2,n1}$ and the stimulus location shown in FIG. 9 will be referred to as $\sigma_{n2,n0}$. When the branch voltages for each of these three stimulus are presented in table form, Table 2 results.

TABLE 2

|  | $R_1$ | $R_2$ | $R_3$ | $R_4$ | $R_5$ |
|---|---|---|---|---|---|
| $\sigma_{n1, n0}$ | 1 | 1 | 0.5 | 0.25 | 0.25 |
| $\sigma_{n2, n0}$ | 0 | 0.5 | 0.25 | 0.375 | 0.375 |
| $\sigma_{n2, n1}$ | 1 | 0.5 | 0.75 | 0.125 | 0.125 |

Examining Table 2, it can be observed that stimulus location $\sigma_{n2,n1}$ creates a larger voltage across $R_3$ than either of the other two stimulus locations. Likewise, it can be seen that stimulus locations $\sigma_{n1,n0}$ and $\sigma_{n2,n1}$ produce equal voltages across $R_1$ and $\sigma_{n2,n0}$ produces no voltage across $R_1$.

When the branch voltage in Table 2 are sorted according to their values, duplicates eliminated, and a rank order number assigned, Table 3 results.

TABLE 3

| Branch Voltage | Rank Order |
|---|---|
| 0 | 0 |
| 0.125 | 1 |
| 0.25 | 2 |
| 0.375 | 3 |
| 0.5 | 4 |
| 0.75 | 5 |
| 1 | 6 |

When the branch voltage values in Table 2 are replaced by the corresponding rank order number and a figure of merit calculated, Table 4 results.

TABLE 4

|  | $R_1$ | $R_2$ | $R_3$ | $R_4$ | $R_5$ | Figure of Merit |
|---|---|---|---|---|---|---|
| $\sigma_{n1, n0}$ | 6* | 6* | 4 | 2 | 2 | 20 |
| $\sigma_{n2, n0}$ | 0 | 4 | 2 | 3* | 3* | 12 |
| $\sigma_{n2, n1}$ | 6* | 4 | 5* | 1 | 1 | 17 |

Note that in Table 4, the best (i.e. highest rank order) entries for each component have been marked with an asterisk (*). The information in Table 4 can then be used to apply the appropriate stimulus selection criteria.

The preceding example was based upon a purely resistive circuit and the stimulus was limited to a single frequency (including DC). When components other than resistors are part of the circuit, complex node voltages may be present. These node voltages are a function of stimulus frequency. The method previously described may be extended to cover this situation by calculating the branch voltages with the stimulus at a number of frequencies at each possible source location. The normal process of rank ordering, calculating a figure of merit, and selection could then be used to select which stimulus location or locations and which frequencies are to be used. The form of Table 2 when extended to multiple frequencies is shown by Table 5.

TABLE 5

|  | Component #1 | Component #2 | Component #3 | ... | Last Component |
|---|---|---|---|---|---|
| $\sigma_{n1, n0, DC}$ |  |  |  |  |  |
| $\sigma_{n1, n0, freq1}$ |  |  |  |  |  |
| $\sigma_{n1, n0, freq2}$ |  |  |  |  |  |
| ... |  |  |  |  |  |
| $\sigma_{n2, n0, DC}$ |  |  |  |  |  |
| $\sigma_{n2, n0, freq1}$ |  |  |  |  |  |
| ... |  |  |  |  |  |
| $\sigma_{n2, n1, DC}$ |  |  |  |  |  |
| $\sigma_{n2, n1, freq1}$ |  |  |  |  |  |
| ... |  |  |  |  |  |

As stated previously, a cost function may also be applied to the branch voltage data. A cost function might be used to reduce (or increase) the desirability of some stimulus over others. For example, voltage measurements at lower frequencies take longer because the measurement interval needs to include the period (or fraction thereof) of the applied frequency. To accommodate a cost function, the node voltage values of various stimulus may be multiplied by appropriate numbers. Multiplication by a positive number less than one lowers the desirability of that stimulus. Multiplication by positive numbers greater than 1 increases the desirability of that source. The cost function used in the above example was one.

As discussed above in step 1028, the branch voltage values that may not result in detectable changes are set to zero, or assigned a zero rank order number. A rule of thumb process for determining which branch voltage values to set to zero is based on Equation 27.

$$\frac{2tV_b}{100} > threshold \qquad (\text{EQN. 27})$$

where $V_b$ is the branch voltage value being checked and t is the tolerance, in percent, of the device that is the branch being checked. Threshold is a predefined number that reflects the accuracy of the measurement hardware. In a preferred embodiment, if the tester hardware cannot detect voltage differences less than 1 microvolt, then threshold would be chosen to be 1 microvolt.

In a preferred embodiment, an efficient method of calculating Table 2 is used. A model of the cluster in the Simplified Tableau form of Equation 1 is the starting point. Equation 1 is given again for convenience.

$$\begin{bmatrix} K_i & -K_v A^T \\ A & 0 \end{bmatrix} \begin{bmatrix} I_b \\ V_n \end{bmatrix} = \begin{bmatrix} S \\ 0 \end{bmatrix} \qquad (\text{EQN. 1})$$

Note that by arranging the rows of Equation 1 to separate the branch currents of the components under test and the branch currents of the current source branches, (assuming there are no voltage sources) $I_b$ can be written as:

$$I_b = \begin{bmatrix} I_{(b,test)} \\ -J \end{bmatrix} \qquad (\text{EQN. 28})$$

where $I_{(b,test)}$ is the set branch currents of the components under test in vector form and -J is the set of branch currents in the current source branches (in vector form.) Making similar splits in $K_i$, $K_v$, and A gives:

$$K_i = \begin{bmatrix} 1 & 0 \\ 0 & 1 \end{bmatrix} \qquad (\text{EQN. 29})$$

$$K_v = \begin{bmatrix} K_{(v,test)} & 0 \\ 0 & 0 \end{bmatrix} \qquad (\text{EQN. 30})$$

$$A = [\, A_{(b,test)} \quad A_J \,] \qquad (\text{EQN. 31})$$

where 1 is an identity matrix so $K_i$ equals an identity matrix. $K_{(v,test)}$ is the submatrix of $K_v$ that corresponds to the components under test. The entries in $K_v$ corresponding to the current sources are zero. Substituting Equations 29–31 into Equation 1 and simplifying gives:

$$\begin{bmatrix} 1 & -K_{(v,test)} A^T_{(b,test)} \\ A_{(b,test)} & 0 \end{bmatrix} \begin{bmatrix} I_{(b,test)} \\ V_n \end{bmatrix} = \begin{bmatrix} 0 \\ A_J J \end{bmatrix} \qquad (\text{EQN. 32})$$

Remember that $A_{(b,test)}$, $I_{(b,test)}$, and $K_{(v,test)}$ normally correspond to the components under test and do not correspond to any portion of the stimulus. Branch voltages are related to node voltages by:

$$V_b = A^T V_n \qquad (\text{EQN. 33})$$

Equation 33 can be separated into the branch voltages of the components under test and the branch voltages of the current source branches similar to the way $I_b$ was separated in Equation 2 to give:

$$V_b = \begin{bmatrix} v_b \\ v_J \end{bmatrix} = A^T V_n = \begin{bmatrix} A^T_{(b,test)} \\ A^T_J \end{bmatrix} V_n \quad \text{(EQN. 34)}$$

Solving Equation 32 for $$\begin{bmatrix} I_{(b,test)} \\ V_n \end{bmatrix}$$

and partitioning gives:

$$\begin{bmatrix} I_{(b,test)} \\ V_n \end{bmatrix} = \quad \text{(EQN. 35)}$$

$$\begin{bmatrix} 1 & -K_{(v,test)}A^T_{(b,test)} \\ A_{(b,test)} & 0 \end{bmatrix}^{-1} \begin{bmatrix} 0 \\ A_J J \end{bmatrix} = \begin{bmatrix} - \\ W \end{bmatrix} \begin{bmatrix} 0 \\ A_J J \end{bmatrix}$$

It follows from Equation 34 and Equation 35 that:

$$v_b = A_{(b,test)}^T V_n = A_{b,test}^T WA_J J \quad \text{(EQN. 36)}$$

In a preferred embodiment, the stimulus is applied one source at a time so the vector J has a single non-zero entry associated with the branch current and zero elsewhere. Applying this stimulus results in a vector of branch voltage, $v_b$. If J was defined as a matrix of single stimulus locations where the stimulus is only at possible stimulus locations as shown in Equation 37, there is now a single current source at each possible stimulus location.

$$J_{matrix} = \begin{bmatrix} J_1 & 0 & 0 & \cdots & 0 \\ 0 & 0 & 0 & & J_{n(n-1)/2} \\ \vdots & \vdots & \vdots & & 0 \\ 0 & 0 & J_3 & \cdots & 0 \\ 0 & J_2 & 0 & \cdots & 0 \end{bmatrix} \quad \text{(EQN. 37)}$$

When $v_b$ is calculated using the $J_{matrix}$ of Equation 37, the result is a matrix where the rows are branch voltages and the columns are the possible source configurations. For convenience, $J_{matrix}$ could also be arranged so that it was diagonal. If this is transposed, a matrix with entries in the form of Table 2 results:

$$\text{table} = (A_{b,test}^T WA_J J_{matrix})^T \quad \text{(EQN. 38)}$$

Equation 38 can be extended to support multiple frequencies. The original system of equations can be used to analyze multiple frequencies by repeating the calculations with the stimulus at different frequencies.

Figure 11A:
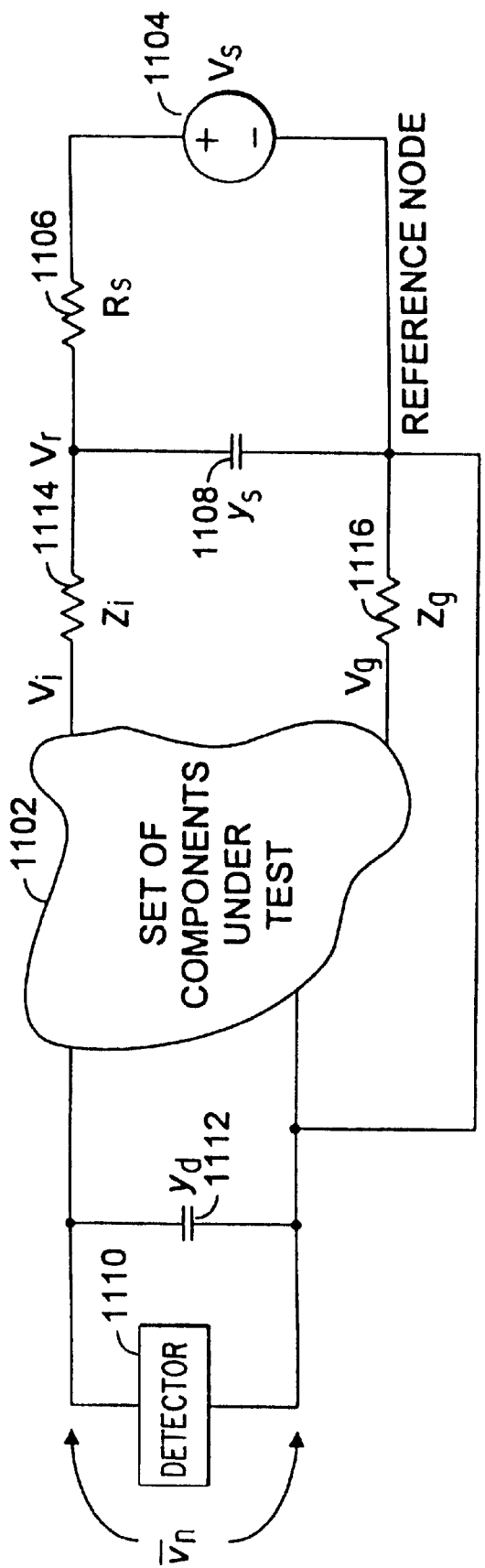
FIG. 11A is a diagram illustrating the non-ideal properties of the measurement and stimulus hardware consistent with an embodiment of the present invention.
Figure 11B:
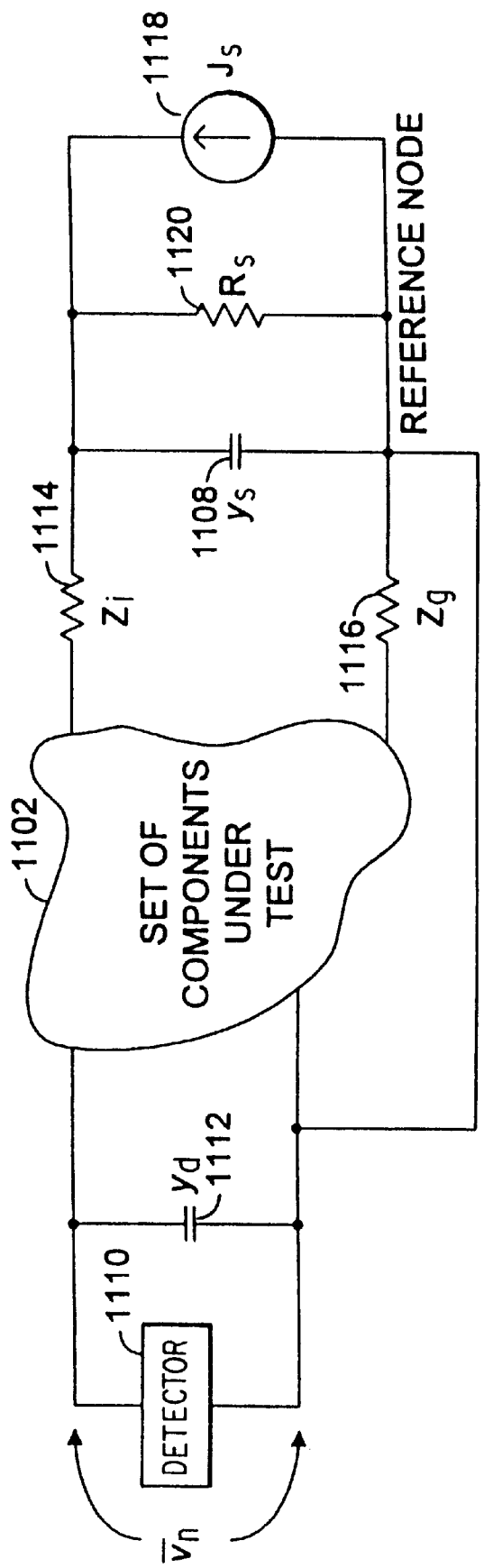
FIG. 11B is a diagram illustrating the non-ideal properties of the measurement and stimulus hardware with the stimulus being replaced by it's thevenin equivalent consistent with an embodiment of the present invention.

The preceding discussions have focused mainly on the case where the applied stimulus and measurement hardware are ideal or have negligible non-ideal properties. However, due to practical considerations involving the design and construction of modern test hardware, both the hardware for applying stimulus, and the measurement apparatus may have significant non-ideal properties. These non-ideal properties are also called parasitic effects. This situation is illustrated in FIGS. 11A and 11B consistent with an embodiment of the present invention. FIGS. 11A and 11B show the same situation except in FIG. 11A the ideal stimulus is shown as a voltage source 1104, $V_s$, in series with a source impedance resistor 1106, $R_s$. In FIG. 11B, the ideal stimulus is shown as the thevenin equivalent of the stimulus in FIG. 11A—a current source 1118 in parallel with source impedance resistor 1120, also $R_s$.

In both FIGS. 11A and 11B, the set of components being tested are shown generally as shape 1102. The non-ideal properties of the stimulus hardware are shown as resistances 1114, $Z_i$, 1116, $Z_g$, and capacitance 1108, $y_s$. The non-ideal properties of the measurement hardware are shown as capacitance 1112, $y_d$, connected to a node from the set of components being tested, and the reference node. Since the dominant component of the non-ideal properties of the detector and the source tends to be capacitance, $y_s$ and $y_d$ are shown as being capacitive. However, these could also include resistive and inductive properties. $Z_i$ and $Z_g$ represent various resistance associated with applying the stimulus to the circuit being tested.

These non-ideal properties of the stimulus hardware, like the stimulus itself, can be included in the model of the set of components. However, the values for $Z_i$ and $Z_g$ may change each time a board is tested since the resistance between a board and the probe pin, among other things, may change each time a board is placed in the test fixture. Finally, in a case where there are fewer detectors than nodes that need to be measured, the non-ideal properties of the measurement hardware will move from node to node with each measurement location. This means the value of $y_d$ will change from measurement location to measurement location. The values of $y_d$ and $y_s$ will also change each time a test fixture is mounted. Accordingly, instead of including all these non-ideal properties in the model when running the test program generator, in a preferred embodiment, a test-time correction is run within the fault analysis routine to translate the values measured by the measurement hardware to values that would have been measured if the measurement and stimulus hardware were ideal. These corrected values may then be used with the U* matrices and test limits generated from a model without these non-ideal properties.

Figure 15:
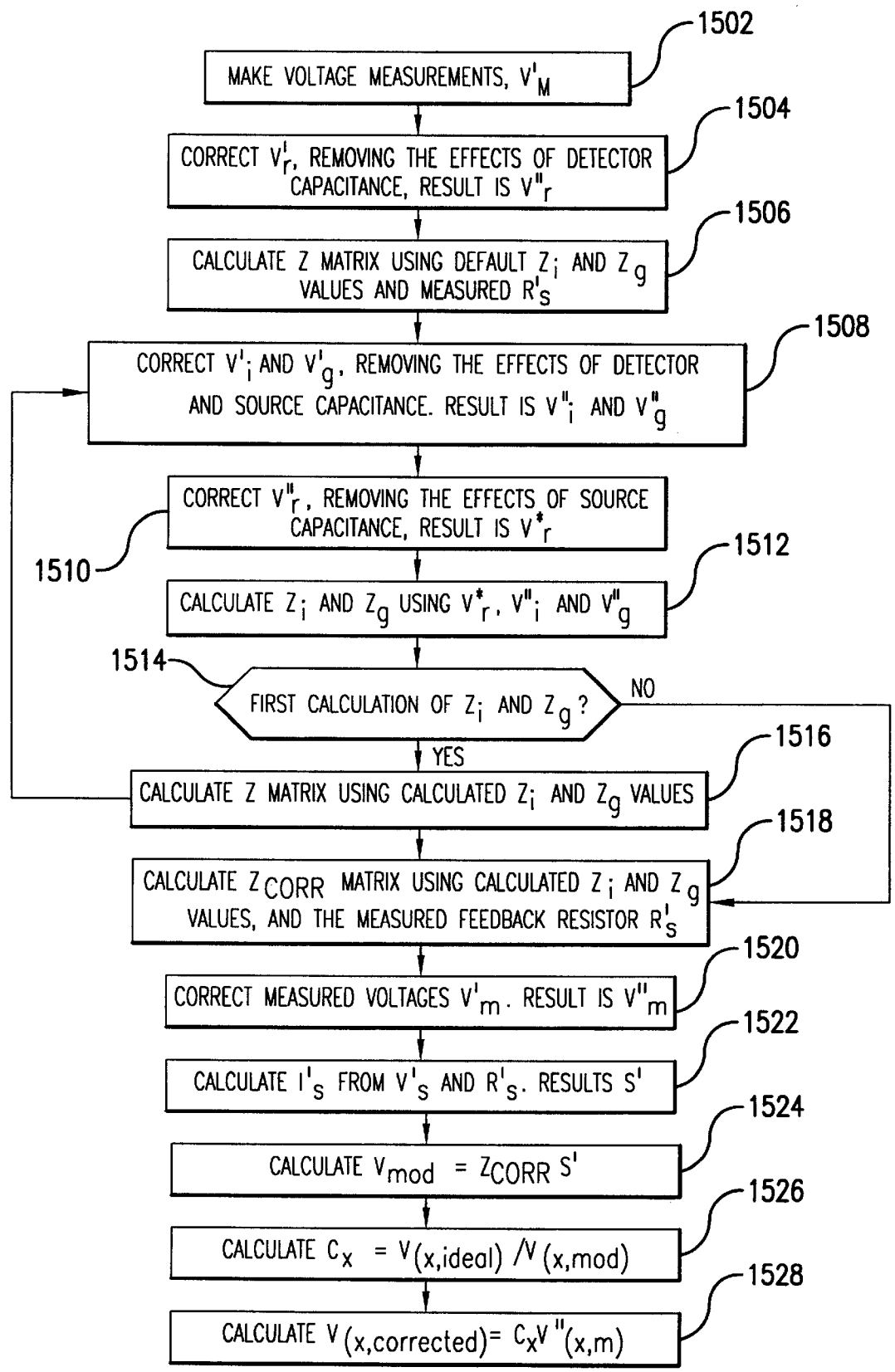
FIG. 15 is a flowchart that illustrates a process that corrects for non-ideal properties of the measurement and stimulus hardware consistent with an embodiment of the present invention.

FIG. 15 illustrates a process that corrects for these non-ideal properties to produce a corrected version of the measured voltages at accessible nodes that approximates the voltages that would be on the measured accessible nodes had the measurement and stimulus hardware been ideal consistent with an embodiment of the present invention. Before the measured voltages are corrected, several measurements are typically taken to characterize the test hardware. One of these measurements is taken of the source voltage, $V_s$. This is an AC voltage so that later measurements taken with this voltage applied can be used to calculate the capacitance on certain nodes. In particular, this measured value is used to calculate the testhead capacitance for both the source and the detector.

Several other hardware dependant measurements may also be taken. These measurements allow calculation of the parasitic capacitance on each source node and the reference node due to the tester hardware. This provides the $y_s$ value for each applied stimulus location. Likewise, these measurements also allow the calculation of the parasitic capacitance on each measurement node due to the tester hardware. This provides the $y_d$ value for each node measured by the measurement hardware. Since the parasitic capacitance of the detector will vary from measurement node to measurement node, the notation $y_{(X,d)}$ is used to indicate the value of the parasitic capacitance at node X (in admittance form) due to the detector being connected to that node. The source capacitance will vary from stimulus location to stimulus location. However, the following discussion is directed to only one source stimulus location so only the notation $y_s$ is used to indicate the source capacitance (in admittance form). This process may be expanded to more stimulus location by using different values of $y_s$ and different incidence matrixes for each stimulus location.

After these characterization measurements have been taken, stimulus may be applied to, and measurements taken on, a board. These measurements can then be corrected for the non-ideal properties of the test environment according to FIG. 15.

In a step 1502, the voltage measurements are taken. These measurements are taken with stimulus applied to the board. The results of these measurements are stored in a vector, $V'_m$. To indicate an individual element of this vector, say the node voltage at node X, the notation $V'_{(X,m)}$ will be used in this discussion. Similar notation will be used to indicate individual elements of other vector quantities.

In addition to measuring the node voltages on the accessible nodes on the board (or alternatively, the cluster, or reduced cluster) under test, measurements are taken of the reference node on the board, $V'_g$, the applied stimulus voltage to the board, $V'_s$ and the voltage on the opposite side of the reference resistor from the stimulus source, $V'_r$. In a step 1504, the measurement taken on the opposite side of the reference resistor, $V'_r$ is corrected using Equation 39 for the effects of the detector capacitance as it measured the voltage $V'_r$. The detector capacitance as it measured the voltage $V'_r$ is $y_{(r,d)}$.

$$V''_r = \frac{V'_s \cdot V'_r}{V'_s - (y_{(r,d)} \cdot R'_s \cdot V'_r)} \quad \text{(EQN. 39)}$$

In a step 1506, a Z matrix is calculated using the nominal values of the board components, default values for $Z_i$ and $Z_g$, and a measured value of the reference resistor, $R'_s$. Default values for $Z_i$ and $Z_g$ may be developed by measuring and averaging $Z_i$ and $Z_g$ for a number of different paths from a source to a board under test. The tableau should also contain entries for $y_d$ and $y_s$. The entry for $y_s$ may be a column in the incidence matrix that defines a connection between $V_r$ and the reference node and an entry in the $K_y$ matrix of zero. The entry for $y_d$ may be a column in the incidence matrix that is all zeros and an entry in the $K_y$ matrix of zero. This allows the value $y_{(X,d)}$ to be plugged into a later equation to calculate the corrected node voltage on node X without having to re-calculate a Z matrix or repeat several other steps shown in FIG. 15. In a step 1508, the measured voltage on the reference node on the board, $V'_g$, and the measured voltage at the stimulus node on the board, $V'_i$, are corrected to remove the effects of the detector capacitance, $y_d$, and the source capacitance, $y_s$. $V'_g$ is corrected using Equation 40. $V'_i$ is corrected using Equation 41.

$$V''_g = V'_g \cdot (1 - Z_{(g,d)} \cdot y_{(g,d)}) - (Z_{(g,s)} \cdot y_s \cdot V''_r) \quad \text{(EQN. 40)}$$

$$V''_i = V'_i \cdot (1 - Z_{(i,d)} \cdot y_{(i,d)}) - (Z_{(i,s)} \cdot y_s \cdot V''_r) \quad \text{(EQN. 41)}$$

In Equations 40 and 41, $Z_{(g,d)}$ is the entry in the last calculated Z matrix corresponding the node $V_g$ and the column corresponding to the branch $y_d$. Similarly, $Z_{(i,d)}$ is the entry in the last calculated Z matrix corresponding the node $V_i$ and the column corresponding to the branch $y_d$. $Z_{(g,s)}$ is the entry in the last calculated Z matrix corresponding the node $V_g$ and the column corresponding to the branch $y_s$. $Z_{(i,s)}$ is the entry in the last calculated Z matrix corresponding the node $V_i$ and the column corresponding to the branch $y_s$.

In a step 1510, $V''_r$ is corrected for the effects of the source capacitance, $y_s$ using Equation 42.

$$V^*_r = \frac{V'_s \cdot V^*_r}{V'_s - (y_s \cdot R'_s \cdot V''_r)} \quad \text{(EQN. 42)}$$

In a step 1512, $Z_i$ and $Z_g$ are calculated using Equations 43 and 44, respectively.

$$Z_i = \frac{R'_s(V^*_r - V''_i)}{V'_s - V^*_r} \quad \text{(EQN. 43)}$$

$$Z_g = \frac{R'_s V''_g}{V'_s - V^*_r} \quad \text{(EQN. 44)}$$

In a step 1514, if this was a first calculation of $Z_i$ and $Z_g$, then the process needs to iterate one more time and proceeds to step 1516. If this is the second time $Z_i$ and $Z_g$ have been calculated, then the process proceeds to step 1518.

In a step 1516, a Z matrix is calculated using values for $Z_i$ and $Z_g$ just calculated. These values for $Z_i$ and $Z_g$ should be plugged into the tableau as admittances in the $K_y$ matrix. The process then loops back to step 1508 where the just calculated Z matrix will supply some of the terms in Equations 42 and 43.

In a step 1518, yet another Z matrix is calculated. This matrix is calculated using the $Z_i$ and $Z_g$ from the second iteration of steps 1508 through 1512. The measured value of the reference resistor $R'_s$ is also used in the calculation of the Z matrix. This matrix is then reduced to include only those rows that correspond to nodes that were measured in step 1502. This reduced matrix is $Z_{corr}$.

In a step 1520, a first correction is calculated on each measured node voltage. If $V'_{(x,m)}$ is the measured voltage at node X, then the first correction is calculated according to Equation 45.

$$V''_{(x,m)} = V'_{(x,m)} \cdot Z_{(x,d)} \cdot y_{(x,d)} - V^* \cdot Z_{(x,s)} \cdot y_s \quad \text{(EQN. 45)}$$

In a step 1522, a measured value of the current flowing through the reference resistor, $I'_s$, is calculated using Ohm's law from the measure value of the source, $V'_s$, and the measured value of the reference resistor, $R'_s$. $I'_s$ is then placed in a source vector S'. The source vector S' is created by placing $I'_s$ in a vector with one column and a row corresponding to each branch in the circuit. $I'_s$ is placed in the row corresponding to the stimulus branch. The rest of the row entries are zero.

In a step 1524, a modified model voltage is calculated for each measured node using Equation 46. $V_{mod}$ is a vector with one column and each row corresponding to a measured node.

$$V_{mod} = Z_{corr} S' \quad \text{(EQN. 46)}$$

In a step 1526, a correction factor $C_f$ is calculated for each measured node. This correction factor is simply the ideal value of each measured node voltage as modeled by a tableau with nominal components and no detector or source parasitic effects divided by the modified model voltage for that node. This is shown in Equation 47.

$$C_x = \frac{V_{(x,ideal)}}{V_{(x,mod)}} \quad \text{(EQN. 47)}$$

Finally, in a step 1528, a corrected value for each measured node voltage is generated using Equation 48.

$$V'_{(x,corrected)} = C_x V''_{(x,m)} \quad \text{(EQN. 48)}$$

These values can then be used to create the vector $\Delta V_{(n,ac,meas)}$ which can be multiplied by the various U* matrices and checked against limits that were generated using a tableau model that did not include the non-ideal properties of the tester hardware.

Many measurement systems will have some error in the measurements they take. This error means that a reported measurement of say 0.15 volts, for example, could correspond to an actual node voltage of as little as 0.149 volts or as much as 0.151 volts. Accordingly, each individual measured node voltage in $V'_m$ could be inside a range with a minimum and a maximum. For example, node X could be within the range given by Equation 49.

$$V'_{(X,m,min)} \leq V'_{(X,m,actual)} \leq V'_{(X,m,max)} \quad \text{(EQN. 49)}$$

These minimums and maximums can be calculated from the $V'_{(X,m)}$ that is returned by the measurement hardware. They may then be passed through the procedure detailed in FIG. 15, above, to produce a $V_{corr,min}$ and a $V_{corr,max}$. $V_{corr,min}$ and $V_{corr,max}$ may then be used to produce a $\Delta V_{min}$ and a $\Delta V_{max}$. These ranges for the individual elements of $\Delta V$ may be used as the constraints in a linear programming problem to find a minimum U*$\Delta V$ and a maximum U*$\Delta V$. Equations 50 and 51 may then be used to govern whether a particular entry in U*$\Delta V$ should be considered zero or non-zero.

$$\gamma_{(ac,f,min)} \leq LP_{min}(U^*_{(ac,f)} \Delta V) \leq \gamma_{(ac,f,max)} \quad \text{(EQN. 50)}$$

$$\gamma_{(ac,f,min)} \leq LP_{max}(U^*_{(ac,f)} \Delta V) \leq \gamma_{(ac,f,max)} \quad \text{(EQN. 51)}$$

where $LP_{min}(U^*\Delta V)$ and $LP_{max}(U^*\Delta V)$ are the minimized and maximized results of the linear programming problem. In other words, if a particular element of the result of the minimization of U*$\Delta V$ subject to the constraints of $\Delta V_{min}$ and a $\Delta V_{max}$ is greater than or equal to the $\gamma_{(ac,f,min)}$ and the result of the maximization of U*$\Delta V$ subject to the constraints of $\Delta V_{min}$ and a $\Delta V_{max}$ is less than or equal to the $\gamma_{(ac,f,max)}$ for that particular element and that particular fault "f", then it should be considered a zero. In this manne, the measurement error of the detector may be taken into account and still be used with the methods detailed above.

Referring back to the discussion of FIG. 2, recall that in a step 206 the circuit was broken down into electrically isolated groups of components called "clusters." By definition, a cluster has at least one node that is inaccessible and has no more than one path joining it to any other cluster. Also recall that these clusters were further broken down in a step 208 by generating smaller "reduced" clusters that contain fewer components and require fewer accessible nodes to test thereby reducing the computational complexity and execution time necessary to generate the equivalence classes, U* matrices and test limits. To help reduce the size of clusters, several rules are typically followed when generating clusters.

The first rule deals with open or apparent open devices. In a preferred embodiment, the test voltages applied by the test hardware are small enough that active devices such as transistors and integrated circuits will not be activated. As such, these active devices can be modeled either in terms of their parasitic effects, or as open or apparent open devices. Therefore, most integrated circuit devices, not-placed jumpers, open switches, and connectors are considered to be open devices. If a device does exhibit an intrinsic impedance, or has significant parasitic effects, it should not be considered as an open device and should be described in the circuit topology. An example of this would be a one-shot integrated circuit that has a built-in resistance between certain pins. Other apparent open devices include active devices such as transistors, diodes, zener diodes, and enhancement mode field effect transistors (FETs). Open and apparent open devices will be removed from the circuit topology during the cluster generation process since they will not contribute to the cluster topology. When these devices are removed, it helps decrease the size of clusters because there are fewer connections in the circuit.

To prevent active devices from being activated, the applied test voltages should always be kept less than the 0.7 volts typically required to forward bias a P-N junction of a silicon diode. Test voltages that are less than or equal to 0.2 volts are even more desirable. Circuits having active devices fabricated from other materials, such as gallium arsenide, or based on other technologies, such as vacuum tubes or both, may have different turn-on voltages and the maximum test voltage can be adjusted accordingly.

The second rule deals with shorted or apparent shorted devices. Shorted devices include fuses, jumpers, and closed switches. Apparent shorted devices include devices that have an impedance that is below a threshold value. This threshold value may be set as an environment variable, or specified by some other form of input to the test generation program. In a preferred embodiment, the default threshold considers any device with an impedance of less than one ohm to be an apparent short.

The third rule deals with variable devices. These typically include variable resistors, potentiometers, variable capacitors, and variable inductors. These devices cannot be attached to an inaccessible node, but they can be part of a cluster topology. In an embodiment of the present invention, if a variable device is connected to an inaccessible node, an error condition is generated and the user notified that another accessible node is necessary to test the variable device.

Figure 12:
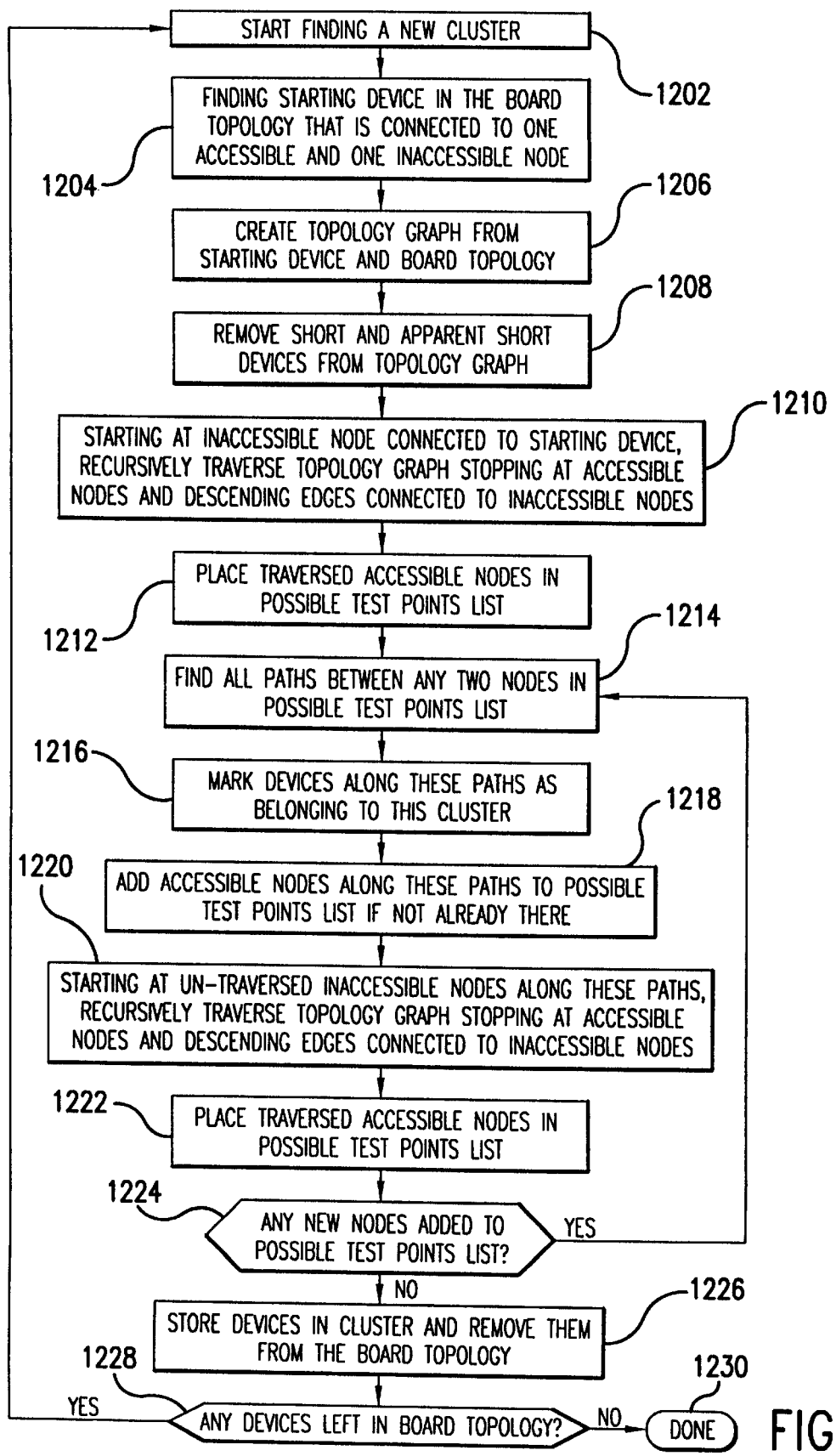
FIG. 12 is a flowchart illustrating a process for generating clusters from a board topology consistent with an embodiment of the present invention.

FIG. 12 is a flowchart illustrating a process for generating clusters from a board topology consistent with an embodiment of the present invention. The process starts generating a cluster from the existing board topology in a step 1202. In a step 1204, the process selects a starting device by searching the board topology for a device that is connected to one accessible node and one inaccessible node. In a step 1206, a topological representation is created. A topological representation represents devices, nodes, and their interconnection. In a preferred embodiment, this topological representation is a topology graph.

The topology graph is created by adding the starting device to an empty undirected graph. Devices are added to the topology graph as edges and the nodes connected to that device are added to the topology graph as vertices. The devices connected to the starting devices are added to the graph. Then the devices connected to those devices are added and so on until all devices that can trace a path to the starting device have been added. As devices are being added to the graph, the first rule stated above is followed so that open or apparent open devices are not added to the graph. This has the effect of "removing" open or apparent open devices from the board and cluster topology. Also, dangling components are not added to the cluster topology. This has the effect of removing dangling components from the cluster topology.

Once constructed, the graph is reduced according to the second rule stated above in a step 1208. In a step 1208, edges associated with short and apparent short devices are removed from the graph and the vertices of these devices are combined into a single vertex. This effectively removes any devices shorted out by these devices from the cluster topology.

In a step 1210, the topology graph is recursively traversed starting with the inaccessible node connected to the starting device. As the graph is being traversed, the recursion stops at accessible nodes, but continues descending edges (devices) connected to inaccessible nodes. In this manner, all of the accessible nodes that are reachable along a path from the starting inaccessible node through only inaccessible nodes are traversed. In a step 1212, the accessible nodes that were stopped at are placed in a list of possible test points.

Figure 13:
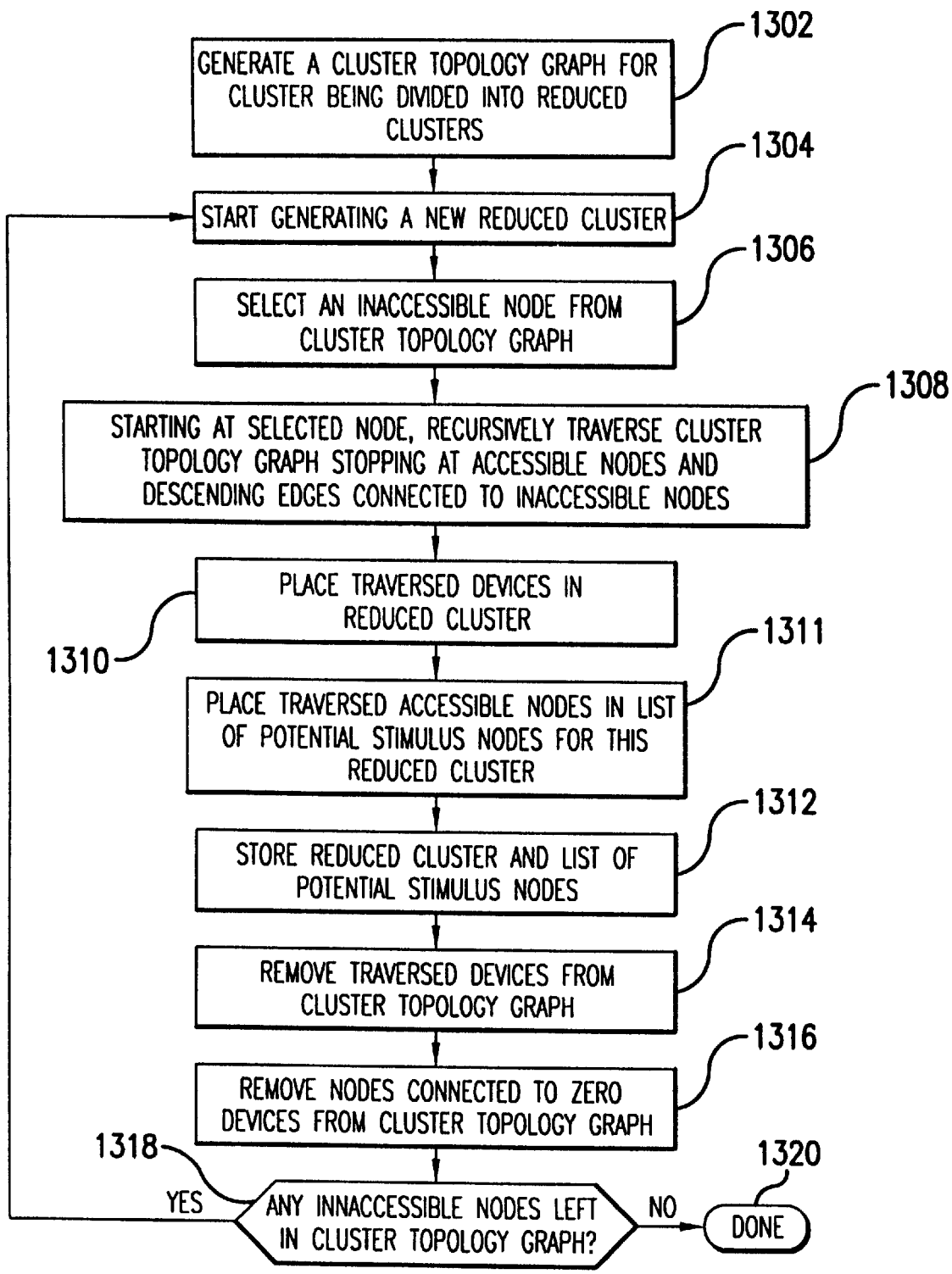
FIG. 13 is a flowchart that illustrates the process for generating reduced clusters from a cluster consistent with an embodiment of the present invention.

The principles used to construct and traverse the topology graph (and the other graphs constructed and traversed in succeeding steps and in FIG. 13) may be used with different topological representations and different traversal methods. These representations and traversal methods are known in the art.

In a step 1214, all the paths between any two nodes in the list of possible test points are found. In a step 1216, all the devices along these paths are marked as being in the cluster being generated. In a step 1218, any accessible nodes along or at the end of the paths found in step 1214 that are not already in the list of possible test points are added to the list of possible test points.

In a step 1220, inaccessible nodes that have not previously been traversed in step 1210 or step 1220 (un-traversed nodes) are used as a starting point for traversing the topology graph. The topology graph is recursively traversed starting with the un-traversed inaccessible node. As the graph is being traversed, the recursion stops at accessible nodes, but continues descending edges (devices) connected to inaccessible nodes. In this manner, all of the accessible nodes that are reachable along a path from the starting untraversed inaccessible node through only inaccessible nodes are traversed. In a step 1222, the accessible nodes that were stopped at are placed in the list of possible test points if they were not already there.

If any nodes were added to the list of possible test points in steps 1218 or step 1220, the process loops back to step 1214. If no nodes were added to the list of possible test points, the process moves to step 1226 where all the devices marked as being in the cluster being generated are stored and then removed from the board topology. In a step 1228, if there are no devices left in the board topology, then the process terminates in a step 1230. If there are still devices left in the board topology, then the process loops back to step 1202 to start generating a new cluster from the devices left in the board topology.

In FIG. 2 in a step 208, each cluster is further broken down into reduced clusters. A reduced cluster is a group of targeted components that reduces the size and complexity of the test generation, measurement, and fault analysis problems in succeeding stages of the test process. FIG. 13 is a flowchart that illustrates the process for generating reduced clusters from a cluster consistent with an embodiment of the present invention.

In a step 1302, a topology graph containing the devices in the cluster being broken into reduced clusters is generated. For this discussion, this will be called the cluster topology graph. To construct the cluster topology graph the process begins with an empty undirected graph. Each device in the cluster is added to the cluster topology graph one at a time. Each device is added to the cluster topology graph as an edge and the nodes connected to that device are added to the topology graph as vertices if not already in the cluster topology graph.

The process for generating an individual reduced cluster begins in a step 1304. In a step 1306, an inaccessible node is selected from the cluster topology graph. In a step 1308, the cluster topology graph is recursively traversed starting with the selected inaccessible node. As the cluster topology graph is being traversed, the recursion stops at accessible nodes, but continues descending edges (devices) connected to inaccessible nodes. In this manner, all of the accessible nodes that are reachable along a path from the starting inaccessible node and through only inaccessible nodes, are traversed. In a step 1310, the devices traversed in step 1308 are placed in the current reduced cluster. In a step 1311, the accessible nodes stopped at in step 1308 are placed in a list of potential stimulus nodes for this reduced cluster. In a step 1312, these devices are stored as a reduced cluster and the list of potential stimulus nodes for this reduced cluster are stored.

In a step 1314, the devices (edges) of the reduced cluster are deleted from the cluster topology graph. In a step 1316, any nodes (vertices) that are no longer connected to any devices are removed from the cluster topology graph. In a step 1318, if there are still inaccessible nodes left in the cluster topology graph, the process loops back to step 1304 to begin generating another reduced cluster. If there are no inaccessible nodes left in the cluster topology graph, the process terminates in a step 1320. Any devices left in the cluster topology graph when the process terminates in step 1320 may be tested by conventional in-circuit test techniques.

Figure 16:
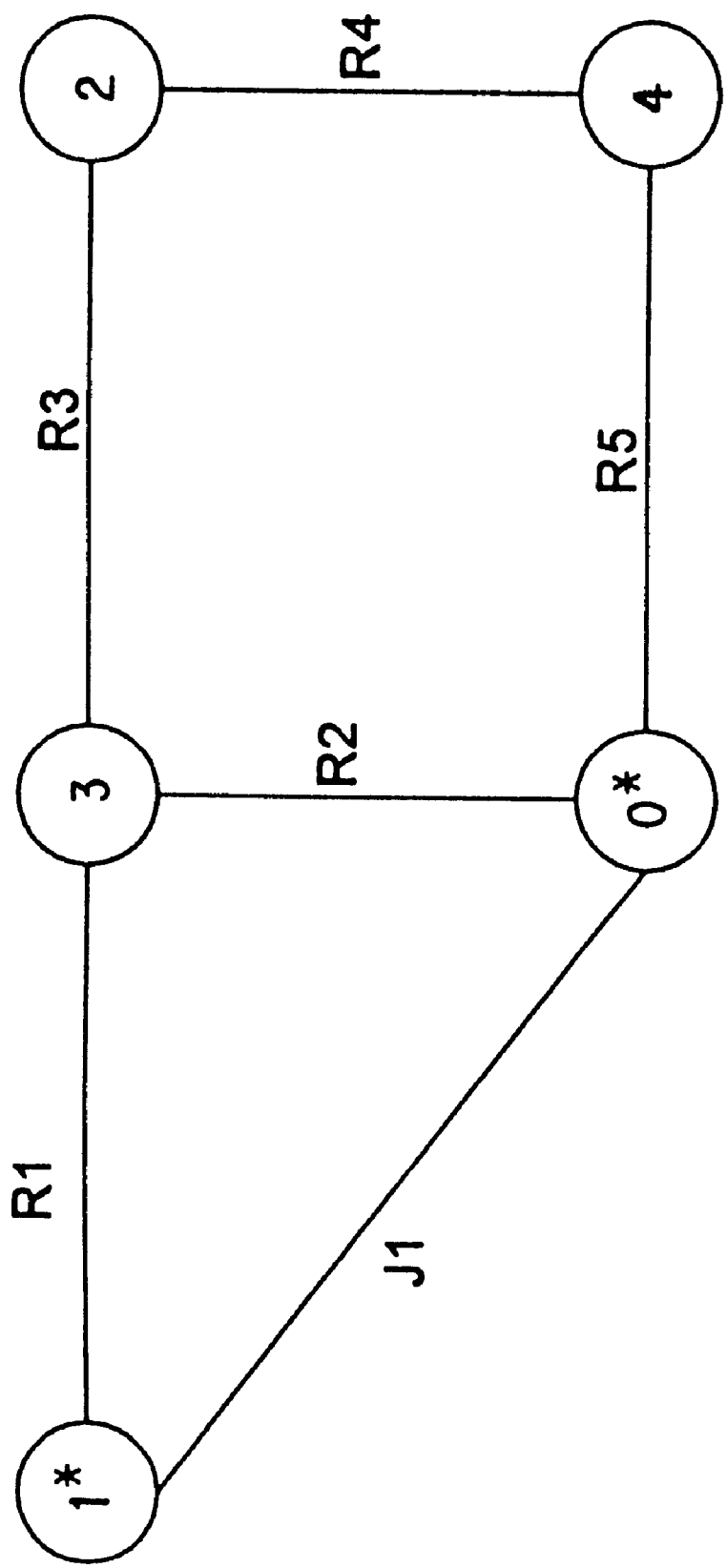
FIG. 16 is a diagram that illustrates a topology graph consistent with an embodiment of the present invention.

Several of the steps in FIG. 12 and FIG. 13 refer to recursively traversing a graph. To illustrate in an exemplary manner this function, examine the exemplary undirected topology graph represented in FIG. 16 consistent with an embodiment of the present invention. The vertexes of the graph represented in FIG. 16 correspond to nodes. The node number is shown inside of each circle. Accessible nodes are shown with an asterisk (*) next to the node number. The rest of the nodes are inaccessible. The edges of the graph represented in FIG. 16 are shown as lines. Each edge corresponds to a component (or branch). The name of the component is shown next to the line. Note that the topology graph in FIG. 16 corresponds to the circuit shown in FIG. 4 except with different accessible nodes.

Say that the traversal starts at node 2. Node 2 is an inaccessible node so all of the branches (or edges) connected to node 2 need to be recursively traversed. This means that edges $R_4$ and $R_3$ are to be traversed. Which one is traversed first does not matter. If $R_4$ is traversed first, it leads to node 4. Since node 4 is also inaccessible, all the branches connected to node 4 except the branch followed to get to node 4 need to be recursively traversed. Accordingly, $R_5$ is then traversed leading to node 0.

Since node 0 is an accessible node, the traversal stops at this node and does not traverse down the branches connected to node 0. The traversal then backs up to node 4. At node 4, all of the branches connected to node 4 have already been traversed (i.e. $R_5$) so the traversal backs back up to node 2. At node 2, $R_4$ has already been traversed, but node 3 has not. Therefore, the traversal continues down $R_3$ to node 3.

At node 3, $R_2$ and $R_1$ have not been traversed. Once again, which one is traversed first does not matter. Accordingly, $R_2$ is arbitrarily chosen first for this example. When $R_2$ is traversed, it leads to node 0. Once again, since node 0 is an accessible node the branches connected to node 0 are not traversed. Note that to avoid an infinite loop, traversal also stops at nodes that have been previously traversed.

After the traversal backs up to node 3, it traverses down branch $R_1$ to node 1. Node 1 is an accessible node so the branches connected to node 1 are not traversed. The traversal then returns to node 3. At node 3, the traversal backs up to node 2 because all of the branches connected to node 3 have been traversed. All of the branches connected to node 2, the starting node, have been recursively traversed. Since all of the branches connected to the starting node have now been traversed, the process ends.

Accordingly, in the above example, the devices traversed are $R_1$, $R_2$, $R_3$, $R_4$, and $R_5$. $J_1$ was not traversed, and the accessible nodes stopped at are nodes 0 and 1.

It may not be necessary to measure all of the accessible nodes connected to devices in the whole cluster to test the components in a reduced cluster. Accordingly, for each reduced cluster, access pruning is performed to determine a minimized set of accessible nodes that need to be measured. By reducing the number of nodes measured, the size of the U matrices, etc. are also reduced. This simplifies the computations necessary to determine if a fault has occurred and speeds test time.

Figure 14:
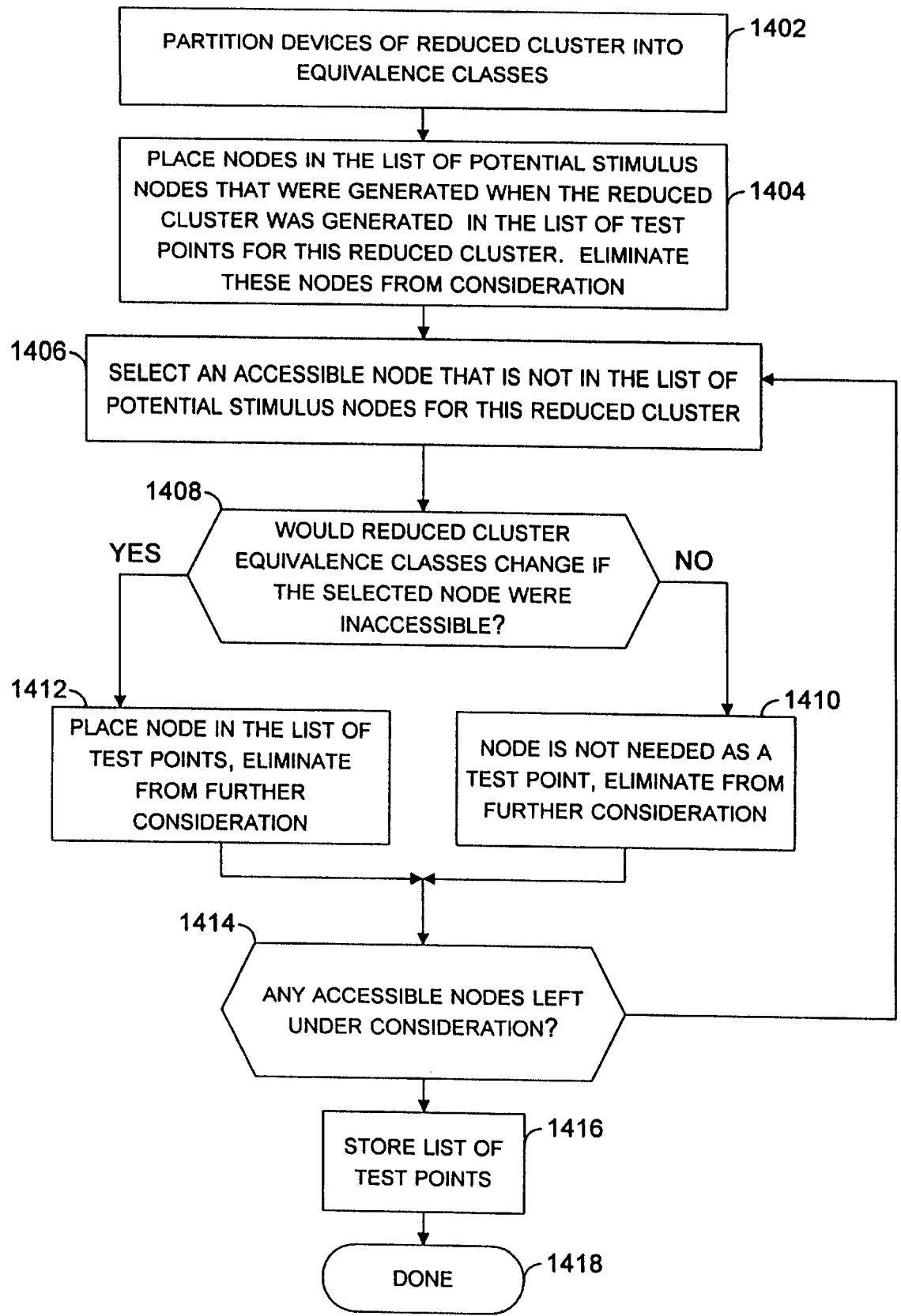
FIG. 14 is a flowchart illustrating the steps taken to perform node pruning for a reduced cluster consistent with an embodiment of the present invention.

FIG. 14 is a flowchart illustrating the steps taken to perform node pruning for a reduced cluster consistent with an embodiment of the present invention. In a step 1402, the devices in the reduced cluster are divided into equivalence classes. This is typically done by first creating a Z matrix for the entire cluster. This Z matrix has rows that correspond to each of the accessible nodes connected to devices in the cluster. The columns correspond to the devices in cluster. The equivalence classes are then produced by checking the columns, and groups of columns, that correspond to the devices in the reduced cluster for independence. This follows the basic procedure for generating equivalence classes described, above, except that only combination of columns corresponding to devices in the reduced cluster are checked.

In a step 1404, the nodes in the list of potential stimulus nodes that were generated when the reduced cluster was generated are placed in the list of test points for this reduced cluster. These nodes are also eliminated from later consideration. That means that these nodes will not be eliminated in later steps as test points. In a step 1406, a node still under consideration for elimination is selected. This node is an accessible node since only accessible nodes can be possible test points.

In a step 1408, a check is made to see if the selected node can be eliminated as a test point without changing the equivalence classes of the reduced cluster. This check is accomplished by first removing the row corresponding to the selected node from the Z matrix used in step 1402. Then, this stripped Z matrix is used to divide the devices of the reduced cluster into equivalence classes. If there is a difference in the equivalence classes just produced and those produced in step 1402, then this node is needed as a test point for this reduced cluster and the process proceeds to step 1412. If there was no difference, this node is not needed as a test point for this reduced cluster and the process proceeds to step 1410.

In a step 1412, a node that is needed as a test point is placed in the list of test points for this reduced cluster. The node is also eliminated from further consideration so it will not be selected again. The process then proceeds to step 1414.

In a step 1410, a node that is not needed as a test point is eliminated from further consideration so it will not be selected again for possible placement in the list of test points for this reduced cluster.

In a step 1414, if there are still accessible nodes under consideration, the process loops back to step 1406. If all of the accessible nodes have been tested to see if they should become test points, the process proceeds to step 1416. In a step 1416, the list of test points for this reduced cluster is stored. Then the process terminates in a step 1418. In a preferred embodiment, only the accessible nodes in the list of test points will be used to generate the U* matrices and test limits for the equivalence classes of this reduced cluster.

Although several specific embodiment of the invention has been described and illustrated, the invention is not to be limited to the specific forms, arrangements, and steps so described and illustrated. For example, many of the stimuli shown in the specific embodiments are shown as current sources. However, these could also be voltage sources. The invention is limited only by the claims.

What is claimed is:

1. A method of testing an electronic circuit, comprising:
applying a stimulus to the electronic circuit under test, wherein said electronic circuit has a plurality of components, said plurality of components including at least a first component and wherein at least one of said plurality of components has a circuit parameter that may vary over a range of values and still be defined as non-faulty, said electronic circuit also having accessible nodes and said electronic circuit having inaccessible nodes, said stimulus being applied to at least a first accessible node;

measuring a first plurality of node voltages at a first plurality of accessible nodes; and, determining from said first plurality of node voltages whether at least one of a first group of components is faulty, said first group of components containing said first component, said first component having a first component value, and wherein at least one of said first group of components is connected to at least one inaccessible node, and wherein said first component is faulty when said first component value is outside a first tolerance range.

2. The method of claim 1 wherein said step of determining further comprises:
arranging said first plurality of node voltages into a node voltage vector; generating a delta vector that is the difference between said node voltage vector and a predefined voltage vector;

multiplying said delta vector by a first rotation matrix to form a first result vector; and, comparing each element of said result vector to an individual element of a set of ranges to determine whether said first component is outside a first tolerance range and wherein each element of said set of ranges is comprised of a maximum value and a minimum value.

3. The method of claim 2, wherein said maximum value and said minimum value of each element of said set of ranges is determined using linear programming.

4. A system for testing for faults in an electronic circuit containing a first set of nodes interconnected by a first set of components, comprising:

a second set of components wherein each member of said second set of components is a member of said first set of components, and wherein each member of said second set of components has a set of parameters that describe the electrical characteristics of that component and each member of said second set of components is not faulty when each member of said set of parameters is within a range of parameter values defined for that parameter and that component;

means for applying a set of stimulus to a second set of nodes, wherein said second set of nodes is a subset of said first set of nodes;

means for measuring a set of responses at a third set of nodes, wherein said third set of nodes is subset of said first set of nodes; and, means for verifying if said set of responses is consistent with at least one fault existing in said electronic circuit.

5. The system of claim 4 further comprising:

means for determining a third set of components wherein the combination of said third set of components and a fourth set of nodes contain at least one fault, and wherein said fourth set of nodes do not have a connection to any component not in said third set of components.

6. The system of claim 5 further comprising:

a processing means, wherein said processing means performs mathematical operations on said set of responses to produce a set of results and if at least one of said set of results is outside of a range of result values defined for that result then said set of responses is consistent with at least one fault existing in said electronic circuit.

7. A program storage medium readable by a computer, tangibly embodying a program of instruction executable by the computer to perform method steps for testing an electronic circuit, said method comprising:

applying a stimulus to an electronic circuit under test, wherein said electronic circuit has a plurality of components, said plurality of components including at least a first component and wherein at least one of said plurality of components has a circuit parameter that may vary over a range of values and still be defined as non-faulty, said electronic circuit also having accessible nodes and said electronic circuit having inaccessible nodes, said stimulus being applied to at least a first accessible node;

measuring a first plurality of node voltages at a first plurality of accessible nodes; and, determining from said first plurality of node voltages whether at least one of a first group of components is faulty, said first group of components containing said first component, said first component having a first component value, and wherein at least one of said first group of components is connected to at least one inaccessible node, and wherein said first component is faulty when said first component value is outside a first tolerance range.

8. The program storage medium of claim 7 wherein said step of determining further comprises:

arranging said first plurality of node voltages into a node voltage vector;

generating a delta vector that is the difference between said node voltage vector and a predefined voltage vector;

multiplying said delta vector by a first rotation matrix to form a first result vector; and, comparing each element of said result vector to an individual element of a set of ranges to determine whether said first component is outside a first tolerance range and wherein each element of said set of ranges is comprised of a maximum value and a minimum value.

9. The program storage medium of claim 8 wherein said maximum value and said minimum value of each element of said set of ranges is determined using linear programming.

10. An apparatus for testing an electronic circuit, comprising:

means for applying a stimulus to an electronic circuit under test, wherein said electronic circuit has a plurality of components, said plurality of components including at least a first component and wherein at least one of said plurality of components has a circuit parameter that may vary over a range of values and still be defined as non-faulty, said electronic circuit also having accessible nodes and said electronic circuit having inaccessible nodes, said stimulus being applied to at least a first accessible node;

means for measuring a first plurality of node voltages at a first plurality of accessible nodes; and, means for determining from said first plurality of node voltages whether at least one of a first group of components is faulty, said first group of components containing said first component, said first component having a first component value, and wherein at least one of said first group of components is connected to at least one inaccessible node, and wherein said first component is faulty when said first component value is outside a first tolerance range.

11. The apparatus of claim 10 further comprising:

means for arranging said first plurality of node voltages into a node voltage vector;

means for generating a delta vector that is the difference between said node voltage vector and a predefined voltage vector;

means for multiplying said delta vector by a first rotation matrix to form a first result vector; and, means for comparing each element of said result vector to an individual element of a set of ranges to determine whether said first component is outside a first tolerance range and wherein each element of said set of ranges is comprised of a maximum value and a minimum value.

12. The apparatus of claim 11 wherein said maximum value and said minimum value of each element of said set of ranges is determined using linear programming performed on a computer.

13. A system for testing for faults in an electronic circuit containing a first set of nodes interconnected by a first set of components wherein a plurality of components of said first set of components each have a set of parameters that describe the electrical characteristics of that component and each of said plurality of components is not faulty when each member of said set of parameters is within a range of parameter values defined for that parameter and that component, comprising:

a stimulator that applies a set of stimulus to a second set of nodes, wherein said second set of nodes is a subset of said first set of nodes;

a measurer that measures a set of responses to said set of stimulus at a third set of nodes, wherein said third set of nodes is subset of said first set of nodes; and, a processing system, said processing system comprising at least one processor, wherein said processing system verifies if said set of responses is consistent with at least one fault existing in said electronic circuit.

14. The system of claim 13 wherein said processing system identifies a third set of components wherein the combination of said third set of components and a fourth set of nodes contain at least one fault, and wherein said fourth set of nodes do not have a connection to any component not in said third set of components.

15. The system of claim 14 wherein said processing system performs mathematical operations on said set of responses to produce a set of results and if at least one of said set of results is outside of a range of result values defined for that result then said set of responses is consistent with at least one fault existing in said electronic circuit.

16. An apparatus for testing an electronic circuit, comprising:

a stimulator that applies a stimulus to an electronic circuit under test, wherein said electronic circuit has a plurality of components, said plurality of components including at least a first component and wherein at least one of said plurality of components has a circuit parameter that may vary over a range of values and still be defined as non-faulty, said electronic circuit also having accessible nodes and said electronic circuit having inaccessible nodes, said stimulus being applied to at least a first accessible node;

a measurer that measures a first plurality of node voltages at a first plurality of accessible nodes, said first plurality of node voltages being in response to said stimulus; and, a processing system, said processing system comprising at least one processor, wherein said processing system determines from said first plurality of node voltages whether at least one of a first group of components is faulty, said first group of components containing said first component, said first component having a first component value, and wherein at least one of said first group of components is connected to at least one inaccessible node, and wherein said first component is faulty when said first component value is outside a first tolerance range.

17. The apparatus of claim 16 wherein said processing system arranges said first plurality of node voltages into a node voltage vector.

18. The apparatus of claim 17 wherein said processing system generates a delta vector that is the difference between said node voltage vector and a selected voltage vector.

19. The apparatus of claim 18 wherein said processing system multiplies said delta vector by a first matrix to form a first result vector.

20. The apparatus of claim 19 wherein said processing system compares each element of said result vector to an individual element of a set of ranges to determine whether said first component is outside a first tolerance range and wherein each element of said set of ranges is comprised of a maximum value and a minimum value.

21. The apparatus of claim 20 wherein said maximum value and said minimum value of each element of said set of ranges is determined using linear programming performed on a computer.

* * * * *